(12) United States Patent
Jung et al.

(10) Patent No.: US 11,895,788 B2
(45) Date of Patent: *Feb. 6, 2024

(54) ELECTRONIC DEVICE AND METHOD FOR INCREASING ANTENNA EFFICIENCY

(71) Applicant: Samsung Electronics Co., Ltd., Gyeonggi-do (KR)

(72) Inventors: Hojin Jung, Gyeonggi-do (KR); Moonsun Kim, Gyeonggi-do (KR); Wonho Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 30 days.

This patent is subject to a terminal disclaimer.

(21) Appl. No.: 17/503,523

(22) Filed: Oct. 18, 2021

(65) Prior Publication Data
US 2022/0053653 A1    Feb. 17, 2022

Related U.S. Application Data

(63) Continuation of application No. 17/130,176, filed on Dec. 22, 2020, now Pat. No. 11,184,987.

(30) Foreign Application Priority Data

Aug. 13, 2020    (KR) ........................ 10-2020-0101867

(51) Int. Cl.
*H05K 5/02*    (2006.01)
*G01D 5/12*    (2006.01)
(Continued)

(52) U.S. Cl.
CPC ............. *H05K 5/0217* (2013.01); *G01D 5/12* (2013.01); *H04B 1/0053* (2013.01); *H04M 1/0268* (2013.01); *H05K 5/0017* (2013.01)

(58) Field of Classification Search
CPC ....... G01D 5/12; G06F 1/1624; G06F 1/1652; G06F 1/1698; H01Q 5/314; H04M 1/0237;
(Continued)

(56) References Cited

U.S. PATENT DOCUMENTS 9,578,147 B2    2/2017    Peng
10,243,259 B2    3/2019    Martinez et al.
(Continued)

FOREIGN PATENT DOCUMENTS

EP         3 926 935 A1    12/2021
KR    10-2014-0105886 A     9/2014
(Continued)

OTHER PUBLICATIONS

Korean Office Action dated Sep. 1, 2023.
European Search Report dated Sep. 28, 2023.

*Primary Examiner* — Nguyen T Vo
(74) *Attorney, Agent, or Firm* — Cha & Reiter, LLC

(57) ABSTRACT

Certain embodiments of the disclosure relate to a device and a method for increasing the efficiency of an antenna of an electronic device that includes a rollable display. The electronic device may include: a processor; a first housing, in which the processor is disposed, including a first conductive portion; a second housing configured to slide in a first direction from the first housing and including a second conductive portion; a rollable display, at least a portion of which is exposed in a slide-out manner according to movement of the second housing; and a variable element disposed in the second housing and is electrically connected to the second conductive portion. The processor may adjust an electrical characteristic of the variable element in response to sliding of the second housing. The disclosure may further include various other embodiments.

20 Claims, 14 Drawing Sheets

(51) Int. Cl.
*H04B 1/00* (2006.01)
*H04M 1/02* (2006.01)
*H05K 5/00* (2006.01)

(58) Field of Classification Search
CPC . H04M 1/0268; H04B 1/0053; H05K 5/0017; H05K 5/0217
See application file for complete search history.

(56) References Cited

U.S. PATENT DOCUMENTS

| | | | |
|---|---|---|---|
| 10,931,323 B2 | 2/2021 | Lee et al. | |
| 11,114,744 B2 | 9/2021 | Park et al. | |
| 11,121,454 B2 | 9/2021 | Zhang | |
| 11,184,987 B1* | 11/2021 | Jung | H05K 5/0217 |
| 2008/0048925 A1* | 2/2008 | Soutome | H01Q 19/28 |
| | | | 343/846 |
| 2011/0117973 A1 | 5/2011 | Asrani et al. | |
| 2011/0148719 A1 | 6/2011 | Okajima | |
| 2013/0005277 A1* | 1/2013 | Klomsdorf | H01Q 1/242 |
| | | | 455/77 |
| 2014/0062817 A1* | 3/2014 | Ishizuka | H03H 7/40 |
| | | | 330/192 |
| 2014/0210685 A1 | 7/2014 | Chang et al. | |
| 2014/0240178 A1 | 8/2014 | Chun et al. | |
| 2015/0200458 A1 | 7/2015 | Peng et al. | |
| 2017/0142241 A1 | 5/2017 | Kim et al. | |
| 2017/0154609 A1 | 6/2017 | Yoon et al. | |
| 2019/0261519 A1 | 8/2019 | Park et al. | |
| 2019/0324521 A1 | 10/2019 | Wang | |
| 2020/0058981 A1 | 2/2020 | Chang et al. | |
| 2020/0125374 A1* | 4/2020 | Lin | H04M 1/0235 |
| 2020/0266524 A1 | 8/2020 | Yoon et al. | |
| 2021/0219437 A1 | 7/2021 | Kim et al. | |

FOREIGN PATENT DOCUMENTS

| | | |
|---|---|---|
| KR | 10-2017-0050270 A | 5/2017 |
| KR | 10-2017-0062327 A | 6/2017 |
| KR | 10-2019-0143029 A | 12/2019 |
| WO | 2019/245165 A1 | 12/2019 |

* cited by examiner

ELECTRONIC DEVICE AND METHOD FOR INCREASING ANTENNA EFFICIENCY

CROSS-REFERENCE TO RELATED APPLICATION(S)

This application is a Continuation of Ser. No. 17/130,176 filed on Dec. 22, 2020 which is based on and claims priority under 35 U.S.C. 119 to Korean Patent Application No. 10-2020-0101867, filed on Aug. 13, 2020, in the Korean Intellectual Property Office, the disclosure of which is herein incorporated by reference in its entirety.

BACKGROUND

1) Field

Certain embodiments disclosed herein generally relate to a device and a method for increasing the efficiency of an antenna of an electronic device that includes a rollable display.

2) Description of Related Art

Development of display technology has involved extensive research and has led to electronic devices with flexible displays. Flexible displays can be folded, bent, rolled, or unfolded, and are also referred to as rollable displays.

Flexible displays generally can be of two types: organic field-emission display device type or liquid crystal display device type. Flexible displays may be manufactured by replacing the glass substrate of existing liquid crystal display devices and organic field-emission display devices with a flexible plastic film, for example.

The above information is presented as background information only to assist with an understanding of the disclosure. No determination has been made, and no assertion is made, as to whether any of the above might be applicable as prior art with regard to the disclosure.

SUMMARY

There has recently been extensive research/development regarding slidable electronic devices where, by applying rollable displays to electronic devices, the display area of the displays can be varied. In the case of a slidable electronic device, a part of the rollable display may move in slide-in or slide-out manner in response to a sliding movement of the housing of the electronic device.

At least a part of the side wall of the housing of the slidable electronic device may include conductive portions (for example, metals), and the conductive portions may be used as antenna radiators for cellular communication or short-range communication (for example, Wi-Fi).

When the housing of the slidable electronic device is slidably movable, the same may cause interference with the conductive portions used as antenna radiators.

An electronic device according to an embodiment may include: a communication module; a processor; a first housing, in which the communication module and the processor are disposed, including a first side wall, a second side wall extending from one end of the first side wall and formed perpendicular to the first side wall, and a third side wall extending from another end of the first side wall and formed parallel to the second side wall, one or more of the first side wall to the third side wall including a first conductive portion electrically connected to the communication module so as to transmit or receive an RF signal; a second housing configured to slide in a first direction from the first housing and including a fourth side wall formed parallel to the first side wall, a fifth side wall extending from one end of the fourth side wall and disposed adjacent to the second side wall, and a sixth side wall extending from another end of the fourth side wall and disposed adjacent to the third side wall, one or more of the fourth side wall to the sixth side wall including a second conductive portion; a rollable display, at least a portion of which is exposed in a slide-out manner according to movement of the second housing in the first direction and is inserted into the first housing in a slide-in manner according to movement of the second housing in a second direction opposite to the first direction; and a variable element disposed in the second housing and is electrically connected to the second conductive portion. The processor may be configured to adjust an electrical characteristic of the variable element in response to sliding of the second housing.

A method of an electronic device according to an embodiment may include identifying a band currently used by a communication module of the electronic device to perform communication; setting an antenna-matching value corresponding to the band; detecting a sliding value corresponding to a distance between a first housing and a second housing of the electronic device; identifying, upon sensing a change in the sliding value, a correction value corresponding to the changed sliding value; and adjusting an electrical characteristic of a variable element of the electronic device, based on the correction value.

An electronic device according to an embodiment may include: a communication module; a processor; a first housing, in which the communication module and the processor is disposed, including a first conductive portion electrically connected to the communication module so as to transmit or receive an RF signal; a second housing configured to slide in a first direction from the first housing and including a second conductive portion disposed adjacent to the first conductive portion; a rollable display, at least a portion of which is exposed in a slide-out manner according to movement of the second housing in the first direction and is inserted into the first housing in a slide-in manner according to movement of the second housing in a second direction opposite to the first direction; and a variable element disposed in the second housing and is electrically connected to the second conductive portion. The processor may be configured to adjust an electrical characteristic of the variable element in response to sliding of the second housing.

Additional aspects will be set forth in part in the description which follows and, in part, will be apparent from the description, or may be learned by practice of the presented embodiments.

BRIEF DESCRIPTION OF THE DRAWINGS

For a more complete understanding of the disclosure and its advantages, reference is now made to the following description taken in conjunction with the accompanying drawings, in which like reference numerals represent like parts.

DETAILED DESCRIPTION

Certain embodiments disclosed herein may provide an electronic device configured such that, even if a part of the housing adjacent to a conductive portion used as an antenna of the electronic device slidably moves, the antenna performance can be maintained, or antenna performance degradation can be reduced.

Figure 1:
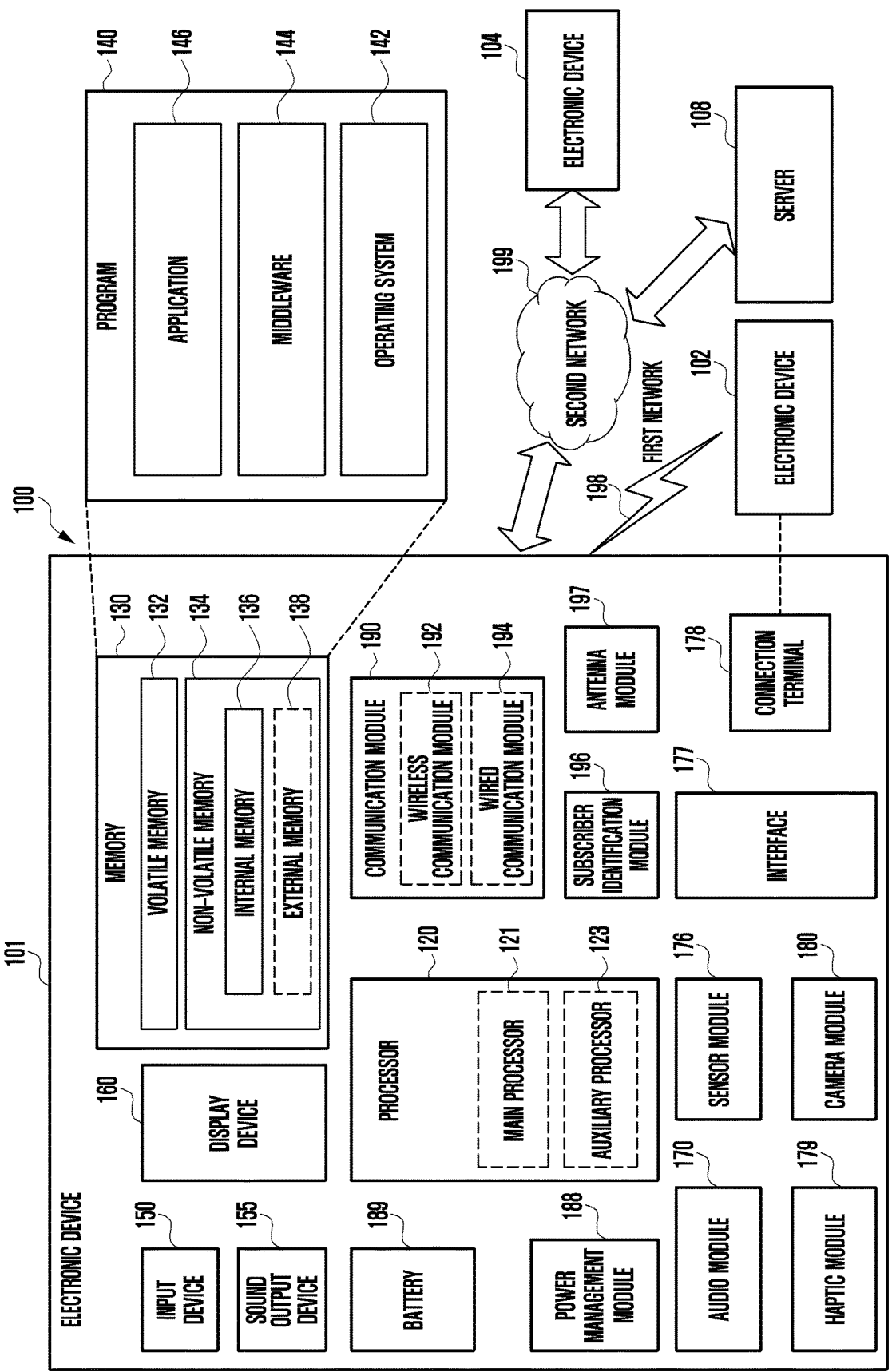
FIG. 1 is a block diagram of an electronic device of a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output device 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the display module 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display module 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., a neural processing unit) may include a hardware structure specialized for processing an artificial intelligence model. Artificial intelligence models can be created through machine learning. Such learning may be performed, for example, in the electronic device 101 itself on which artificial intelligence is performed, or may be performed through a separate server (for example, the server 108). The learning algorithm may include, for example, supervised learning, unsupervised learning, semi-supervised learning, or reinforcement learning, but is not limited the above-described example. The artificial intelligence model may include a plurality of artificial neural network layers. Artificial neural networks may include a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-networks, or a combination of two or more of the above, but is not limited to the above-described example. In addition to the hardware structure, the artificial intelligence model may additionally or alternatively include a software structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input module 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or infrared data association (IrDA)) or the second network 199 (e.g., a long-range communication network, such as a legacy cellular network, 5G network, next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network and a next-generation communication technology after a 4G network, for example, a new radio (NR) access technology. The NR access technology may support high-speed transmission of high-capacity data (enhanced mobile broadband (eMBB)), minimization of terminal power and connection of multiple terminals (massive machine type communications (eMTC)), or high reliability and low latency (ultra-reliable and low-latency (URLLC)). The wireless communication module 192 may support a high frequency band (eg, mmWave band), for example, to achieve a high data rate. The wireless communication module 192 may support various technologies for securing performance in a high frequency band, for example, beamforming, massive MIMO (multiple-input and multiple-output), FD-MIMO (full dimensional MIMO), array antennas, analog beam-forming, or large scale antennas. The wireless communication module 192 may support various requirements specified in the electronic device 101, an external electronic device (e.g., the electronic device 104), or a network system (e.g., the second network 199). According to an embodiment, the wireless communication module 192 may support a peak data rate for realizing eMBB (e.g., 20 Gbps or more), loss coverage for realizing mMTC (e.g., 164 dB or less), or U-plane latency for realizing URLLC (e.g., downlink (DL) and uplink (UL) each 0.5 ms or less, or round trip 1 ms or less).

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC that is disposed on or adjacent to a first side (eg, a lower side) of the printed circuit board and capable of supporting a designated high frequency band (e.g., mmWave band), and a plurality of antennas (e.g., array antennas) that are disposed on or adjacent to the second side (e.g., top or side) of the printed circuit board and capable of transmitting or receiving a signal of the designated high frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, MEC (mobile edge computing), or client-server computing technology may be used, for example. The electronic device 101 may provide an ultra-low delay service using, for example, distributed computing or mobile edge computing. In another embodiment, the external electronic device 104 may include an Internet of Things (IoT) device. The server 108 may be an intelligent server using machine learning and/or neural networks. According to an embodiment, the external electronic device 104 or the server 108 may be included in the second network 199. The electronic device 101 may be applied to an intelligent service (e.g., smart home, smart city, smart car, or healthcare) based on 5G communication technology and IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked.

The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAYSTORE), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed on different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 4:
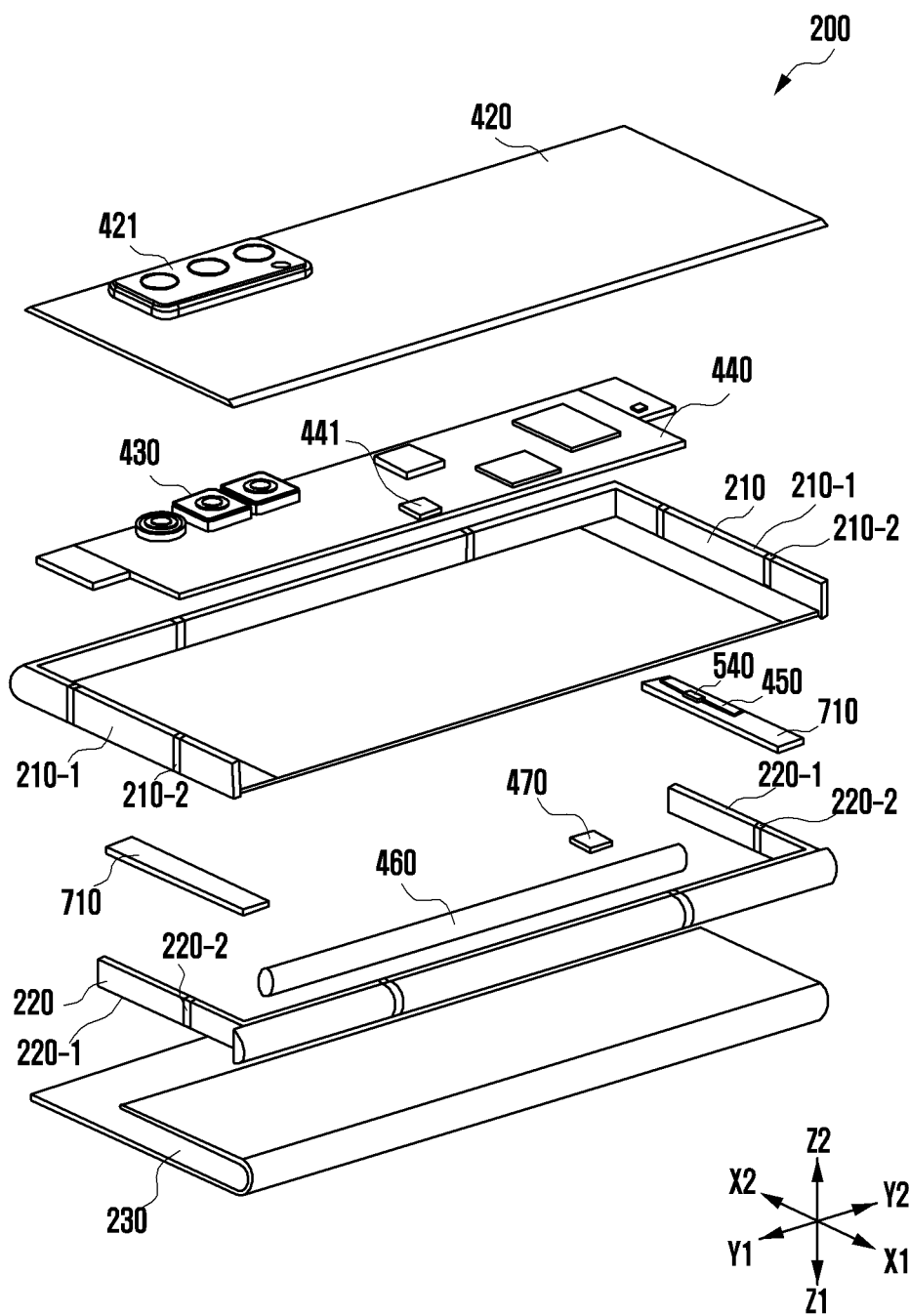
FIG. 4 is an exploded perspective view of an electronic device according to one embodiment.

An electronic device (e.g., the electronic device 101 in FIG. 1) according to an embodiment may include: a communication module (e.g., the communication module 190 in FIG. 1); a processor (e.g., the processor 120 in FIG. 1); a first housing 210 (e.g., the first housing 210 in FIG. 2A), in which the communication module 190 and the processor 120 are disposed, including a first side wall (e.g., the first side wall 211 in FIG. 2A), a second side wall (e.g., the second side wall 212 in FIG. 2A) extending from one end of the first side wall 211 and formed perpendicular to the first side wall 211, and a third side wall (e.g., the third side wall 213 in FIG. 2A) extending from another end of the first side wall 211 and formed parallel to the second side wall 212, one or more of the first side wall 211 to the third side wall 213 including a first conductive portion (e.g., the first conductive portion 210-1 in FIG. 2A) electrically connected to the communication module 190 so as to transmit or receive an RF signal; a second housing 220 (e.g., the second housing 220 in FIG. 2A) configured to slide in a first direction from the first housing 210 and including a fourth side wall (e.g., the fourth side wall 221 in FIG. 2A) formed parallel to the first side wall 211, a fifth side wall (e.g., the fifth side wall 222 in FIG. 2A) extending from one end of the fourth side wall 221 and disposed adjacent to the second side wall 212, and a sixth side wall (e.g., the sixth side wall 223 in FIG. 2A) extending from another end of the fourth side wall 221 and disposed adjacent to the third side wall 213, one or more of the fourth side wall 221 to the sixth side wall 223 including a second conductive portion (e.g., the second conductive portion 220-1 in FIG. 2A); a rollable display (e.g., the rollable display 230 in FIG. 2A), at least a portion of which is exposed in a slide-out manner according to movement of the second housing 220 in the first direction and is inserted into the first housing 210 in a slide-in manner according to movement of the second housing 220 in a second direction opposite to the first direction; and a variable element (e.g., the variable element 540 in FIG. 4 disposed in the second housing 220 and is electrically connected to the second conductive portion 220-1, wherein the processor 120 adjusts an electrical characteristic of the variable element 540 in response to sliding of the second housing 220.

According to one embodiment, the processor 120 may change capacitance of the variable element 540 in response to the sliding of the second housing 220.

According to one embodiment, the processor 120 may change inductance of the variable element 540 in response to the sliding of the second housing 220.

According to one embodiment, the electronic device may further include: a magnet disposed in the second housing 220; and a sliding sensor disposed in the first housing 210 and is configured to measure a magnetic force from the magnet so as to measure the distance between the first housing 210 and the second housing 220.

According to one embodiment, the processor 120 may measure the distance between the first housing 210 and the second housing 220 via the sliding sensor, and may determine, based on the distance between the first housing 210 and the second housing 220, a correction value for adjusting the electrical characteristic of the variable element 540.

According to one embodiment, the processor 120 may identify a band currently used by the communication module 190 to perform communication, may set an antenna-matching value corresponding to the band, may detect a sliding value corresponding to the distance between the first housing 210 and the second housing 220, may identify, upon sensing a change in the sliding value, a correction value corresponding to the changed sliding value, and may adjust the electrical characteristic of the variable element 540, based on the correction value.

According to one embodiment, the electronic device may further include: a first printed circuit board disposed in the first housing 210 and including the processor 120 and the communication module 190; a second printed circuit board disposed in the second housing 220 and including the variable element 540; and a flexible circuit board connecting the first printed circuit board to the second printed circuit board.

According to one embodiment, the variable element 540 may be disposed to be adjacent to the fifth side wall 222 and/or the sixth side wall 223 on the second printed circuit board.

In a method of an electronic device 101 according to an embodiment may include identifying a band currently used by a communication module 190 of the electronic device 101 to perform communication; setting an antenna-matching value corresponding to the band; detecting a sliding value corresponding to a distance between a first housing 210 and a second housing 220 of the electronic device 101; identifying, upon sensing a change in the sliding value, a correction value corresponding to the changed sliding value; and adjusting an electrical characteristic of an variable element 540 of the electronic device 101, based on the correction value.

According to one embodiment, the first housing 210, in which the communication module 190 is disposed, includes a first side wall 211, a second side wall 212 extending from one end of the first side wall 211 and formed perpendicular to the first side wall 211, and a third side wall 213 extending from another end of the first side wall 211 and formed parallel to the second side wall 212, one or more of the first side wall 211 to the third side wall 213 including a first conductive portion 210-1 electrically connected to the communication module 190 so as to transmit or receive an RF signal.

According to one embodiment, the second housing 220 may be configured to slide in a first direction from the first housing 210 and includes a fourth side wall 221 formed parallel to the first side wall 211, a fifth side wall 222 extending from one end of the fourth side wall 221 and disposed adjacent to the second side wall 212, and a sixth side wall 223 extending from another end of the fourth side wall 221 and disposed adjacent to the third side wall 213, one or more of the fourth side wall 221 to the sixth side wall 223 including a second conductive portion 220-1.

According to one embodiment, the electronic device 101 may further include a rollable display 230, at least a portion of which is exposed in a slide-out manner according to movement of the second housing 220 in the first direction and is inserted into the first housing 210 in a slide-in manner according to movement of the second housing 220 in a second direction opposite to the first direction.

According to one embodiment, the variable element 540 may be disposed in the second housing 220 and may be electrically connected to the second conductive portion 220-1.

According to one embodiment, the electrical characteristic of the variable element 540 may be adjusted in response to sliding of the second housing 220.

According to one embodiment, the method may further include changing the capacitance of the variable element 540 in response to the sliding of the second housing 220.

The method may further include changing the inductance of the variable element 540 in response to the sliding of the second housing 220.

According to one embodiment, the electronic device 101 may further include: a magnet disposed in the second housing 220; and a sliding sensor disposed in the first housing 210 and is configured to measure a magnetic force from the magnet so as to measure the distance between the first housing 210 and the second housing 220.

According to one embodiment, the method may further include: measuring the distance between the first housing 210 and the second housing 220 via the sliding sensor.

According to one embodiment, the method may further include increasing the capacitance of the variable element 540 so as to reduce the resonance frequency of the second conductive portion 220-1.

According to one embodiment, the method may further include increasing the inductance of the variable element 540 so as to increase the resonance frequency of the second conductive portion 220-1.

An electronic device 101 according to an embodiment may include: a communication module 190; a processor 120; a first housing 210, in which the communication module 190 and the processor 120 are disposed, including a first conductive portion 210-1 electrically connected to the communication module 190 so as to transmit or receive an RF signal; a second housing 220 configured to slide in a first direction from the first housing 210 and including a second conductive portion 220-1 disposed adjacent to the first conductive portion 210-1; a rollable display 230, at least a portion of which is exposed in a slide-out manner according to movement of the second housing 220 in the first direction and is inserted into the first housing 210 in a slide-in manner according to movement of the second housing 220 in a second direction opposite to the first direction; and a variable element 540 disposed in the second housing 220 and is electrically connected to the second conductive portion 220-1, wherein the processor 120 adjusts an electrical characteristic of the variable element 540 in response to sliding of the second housing 220.

According to one embodiment, the processor 120 may change the capacitance of the variable element 540 in response to the sliding of the second housing 220.

According to one embodiment, the processor 120 may change the inductance of the variable element 540 in response to the sliding of the second housing 220.

According to one embodiment, the processor 120 may measure the distance between the first housing 210 and the second housing 220 via a sliding sensor; and may determine, based on the distance between the first housing 210 and the second housing 220, a correction value for adjusting the electrical characteristic of the variable element 540.

Figure 2A:
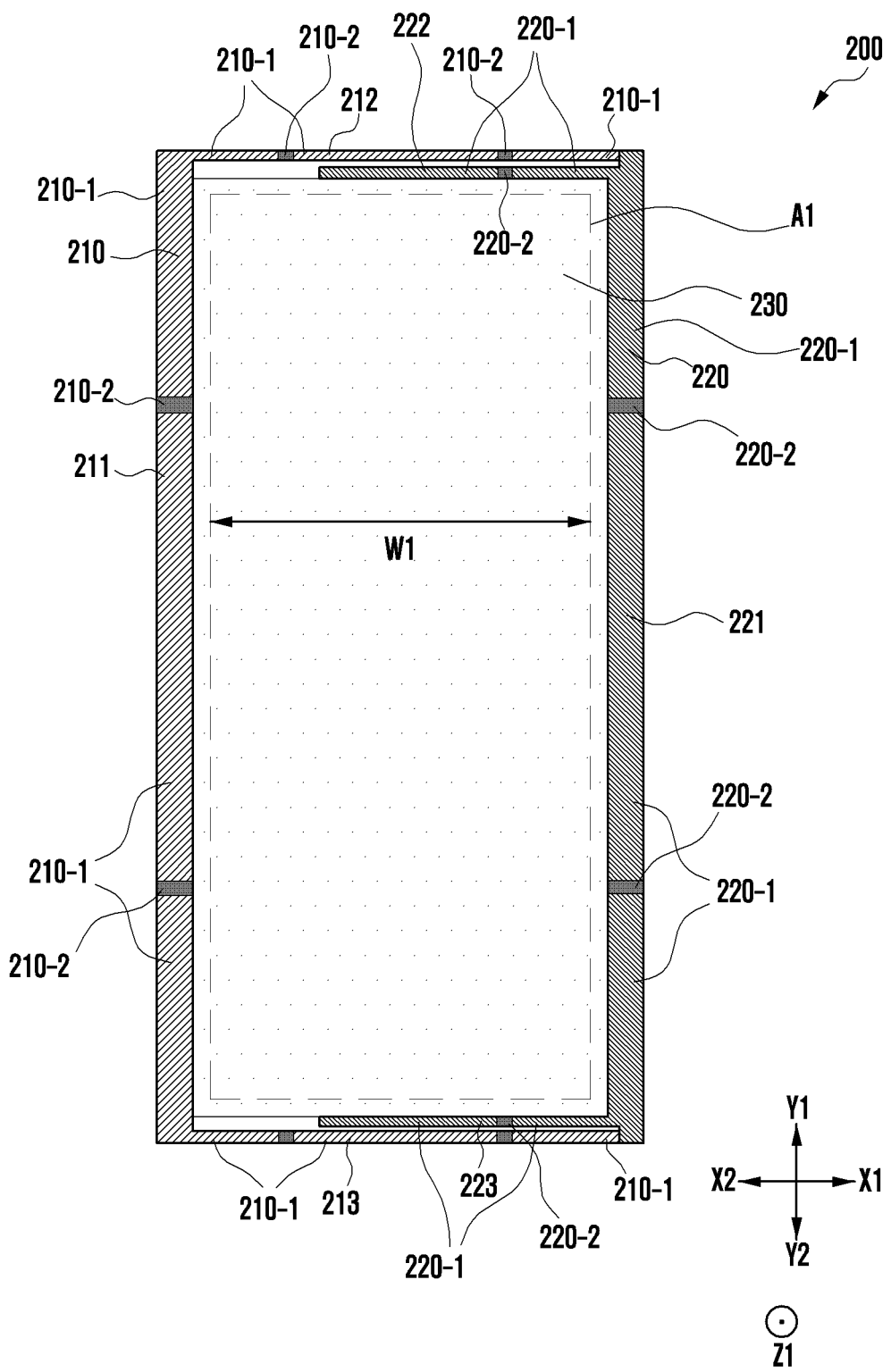
FIG. 2A is a front view of an electronic device according to an embodiment in which a size of a rollable display is minimized.
Figure 2B:
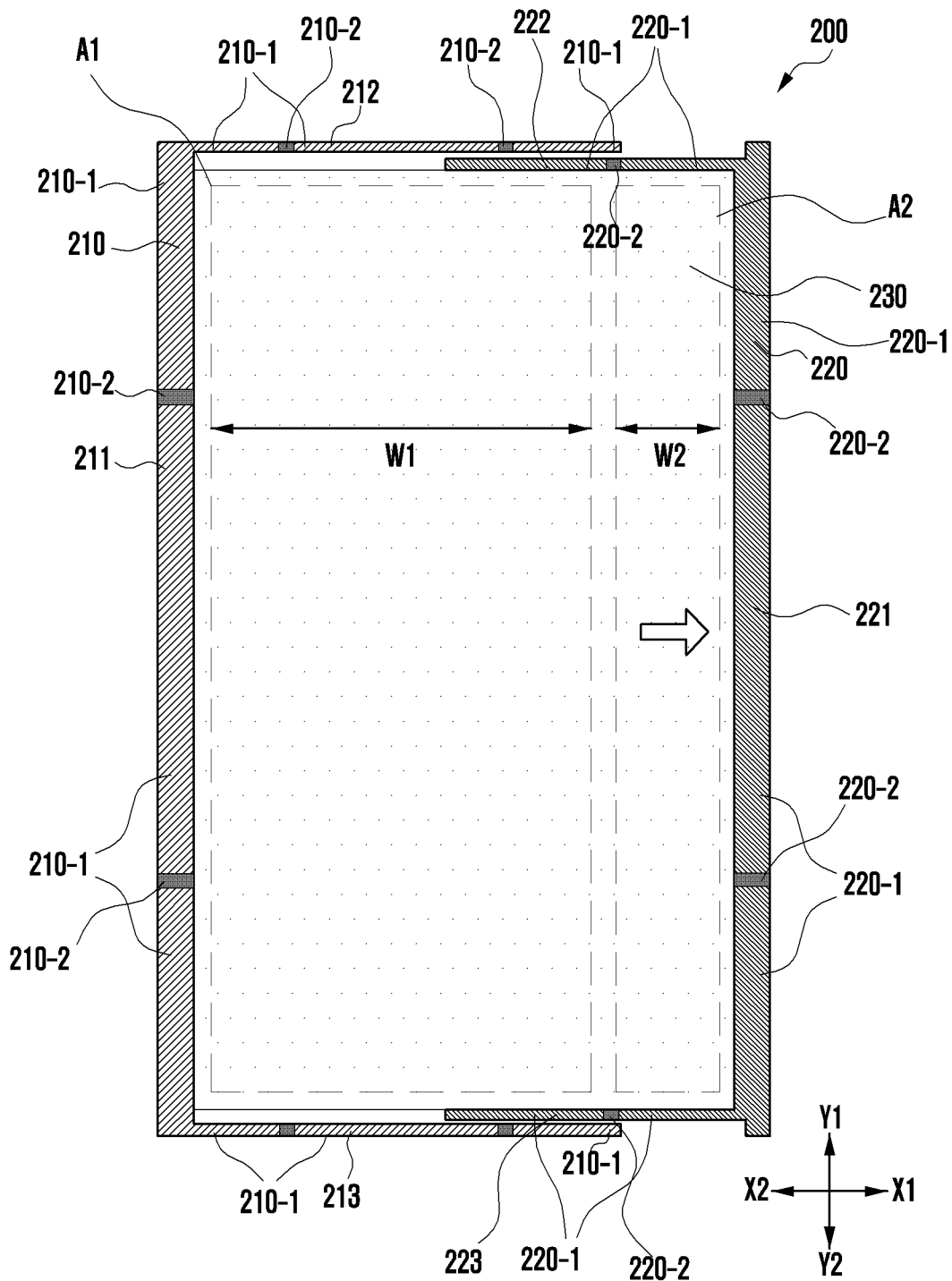
FIG. 2B is a front view of an electronic device according to an embodiment in which a size of a rollable display is medium.
Figure 2C:
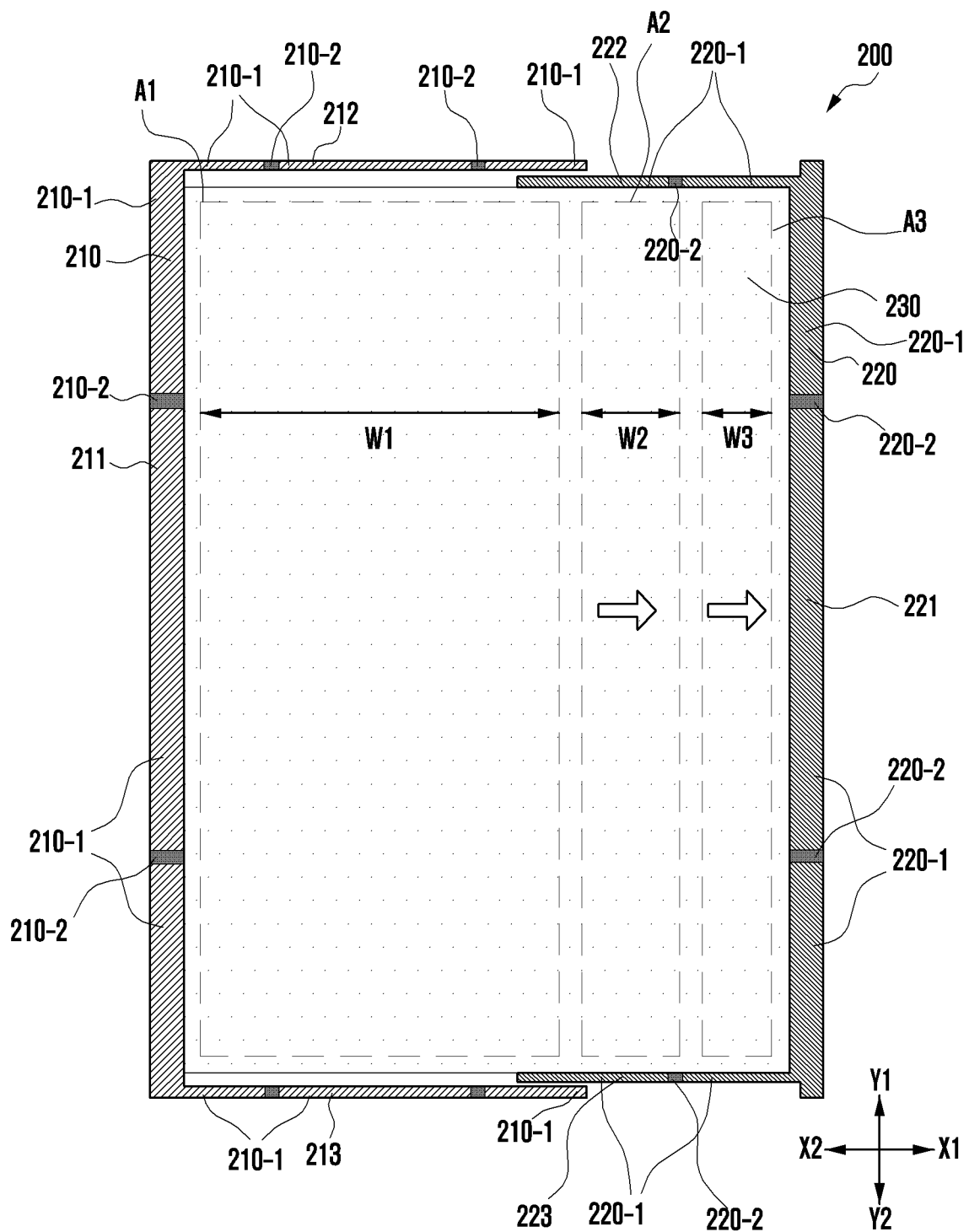
FIG. 2C is a front view of an electronic device according to an embodiment in which a size of a rollable display is maximized.

FIG. 2A illustrates a first state of an electronic device 200 according to an embodiment (e.g., the state in which a rollable display 230 is minimized), and illustrates the state in which a portion of the rollable display 230 (e.g., the second region A2 in FIG. 2B and the third region A3 in FIG. 2C) is received (i.e. disposed) in a housing. FIG. 2B illustrates a second state of the electronic device 200 according to an embodiment (e.g., the state in which the rollable display 230 has a medium-sized area), and illustrates the state in which a portion of the rollable display 230 (e.g., the third region A3 in FIG. 2C) is received in the housing. FIG. 2C illustrates a third state of the electronic device 200 according to an embodiment (e.g., the state in which the rollable display 230 is maximized), and illustrates the state in which most of the rollable display 230 is visually exposed to the exterior of the electronic device. FIG. 2A may be a front view of the electronic device 200 according to an embodiment, which is seen along direction Z1 (e.g., the third direction besides the first horizontal and the second vertical directions), FIG. 2B may be a front view of the electronic device 200 according to an embodiment, which is seen along direction Z1 (e.g., the third direction), and FIG. 2C may be a front view of the electronic device 200 according to an embodiment, which is seen along direction Z1 (e.g., the third direction).

Referring to FIGS. 2A to 2C, the electronic device 200 (e.g., the electronic device 101 in FIG. 1) according to one embodiment may include a first housing 210 and a second housing 220, wherein the second housing 220 is capable of sliding from the first housing 210. According to one embodiment, the second housing 220 may be slidably disposed at one surface of the first housing 210. According to one embodiment, the first housing 210 is fixed and the second housing 220 may be capable of reciprocating a predetermined distance in a designated direction (e.g., the first direction X1) from the first housing 210.

According to one embodiment, the first housing 210 may be called the main part or the main housing. According to one embodiment, the first housing 210 may receive various types of electric or electronic components such as a main printed circuit board (e.g., the first printed circuit board 440 in FIG. 4) or a battery.

According to one embodiment, the first housing 210 may include a side wall that is made of a conductive material, and a portion of the side wall may be used as an antenna radiator for cellular communication or short-range communication (e.g., Wi-Fi). According to one embodiment, the first housing 210 may include: a first side wall 211; a second side wall 212 extending from one end of the first side wall 211 in a direction perpendicular to the first side wall 211; and a third side wall 213 extending from another end of the first side wall 211 in the direction perpendicular to the first side wall 211. The second side wall 212 and the third side wall 213 may be disposed opposite to each other.

According to one embodiment, each of the first side wall 211, the second side wall 212, and/or the third side wall 213 may include a first conductive portion 210-1, and the first conductive portion 210-1 may be used as an antenna radiator for cellular communication or short-range communication (e.g., Wi-Fi). According to one embodiment, the first conductive portions 210-1 of each of the first side wall 211, the second side wall 212, and/or the third side wall 213 may be segmented by at least one first non-conductive portion 210-2.

According to one embodiment, the first conductive portion 210-1 of the first housing 210 may be electrically connected to a communication module, and may thereby be used as an antenna radiator for cellular communication or short-range communication (e.g., Wi-Fi).

According to one embodiment, the second housing 220 may include a side wall made of a conductive material. According to one embodiment, the second housing 220 may include: a fourth side wall 221 disposed opposite to the first side wall 211 of the first housing 210; a fifth side wall 222 extending from one end of the fourth side wall 221 in a direction perpendicular to the fourth side wall 221; and a sixth side wall 223 extending from another end of the fourth side wall 221 in the direction perpendicular to the fourth side wall 221. The fifth side wall 222 and the sixth side wall 223 may be disposed opposite to each other. The fifth side wall 222 of the second housing 220 may be disposed opposite to the second side wall 212 of the first housing 210. The sixth side wall 223 of the second housing 220 may be disposed opposite to the third side wall 213 of the first housing 210.

According to one embodiment, each of the fourth side wall 221, the fifth side wall 222, and the sixth side wall 223 may include a second conductive portion 220-1. The second conductive portion 220-1 of each of the fourth side wall 221, the fifth side wall 222, and the sixth side wall 223 may be segmented by at least one second non-conductive portion 220-2.

According to one embodiment, the second housing 220 may include within it a slide plate (e.g., the slide plate in FIGS. 3B and 3C) on which the rollable display 230 is stably placed. At least a portion of the rollable display 230 may be stably placed on one surface of the second housing 220. At least a portion of the rollable display 230 stably placed on one surface of the second housing 220 may be visible from the front of the electronic device 200 (along direction Z1).

According to one embodiment, the rollable display 230 may include: a window, a polarizing film, an organic light-emitting layer (e.g., an organic light-emitting diode (OLED) layer), a thin film transistor (TFT), and/or a flexible substrate (e.g., a polyimide substrate). For example, the rollable display 230 may include a polyimide substrate, and thus the stress that is caused when the display is bent may be reduced, whereby the rollable display 230 can be folded, bent, rolled, or unrolled.

According to one embodiment, the rollable display 230 may include: a first region A1 fixedly and visually exposed in the direction Z1 from the front of the electronic device 200; a second region A2, which slides in according to the movement of the second housing 220 so as to be hidden or slides out according to the movement of the second housing 220 so as to be exposed to the exterior of the electronic device; and a third region A3. According to one embodiment, the first region A1 may have a first width W1. The second region A2 may have a second width W2. The third region A3 may have a third width W3.

For example, the second region A2 and the third region A3 of the rollable display 230 may roll out according to the movement of the second housing 220 in the first direction X1, and may thus be visually exposed to the exterior of the electronic device. Conversely, the second region A2 and the third region A3 of the rollable display 230 may roll in according to the movement of the second housing 220 in the second direction X2 opposite to the first direction X1, and thus may be hidden.

Referring to FIG. 2A, in the electronic device 200, the second region A2 and the third region A3 of the rollable display 230 may roll in according to the maximum designated movement of the second housing 220 in the second direction X2, and thus may not be visually exposed to the exterior of the electronic device. Herein, the exposed width of the rollable display 230 may be the first width W1.

Referring to FIG. 2B, in the electronic device 200, at least a portion of the second region A2 of the rollable display 230 may roll out according to the movement of the second housing 220 in the first direction X1, and may thus be exposed to the exterior of the electronic device, and the third region A3 may not be exposed. Herein, the exposed width of the rollable display 230 may be the sum of the first width W1 and the second width W2.

Referring to FIG. 2C, in the electronic device 200, the second region A2 and the third region A3 of the rollable display 230 may roll out according to the maximum designated movement of the second housing 220 in the first direction X1, and may thus be visually exposed to the exterior of the electronic device. Herein, the exposed width of the rollable display 230 may be the sum of the first width W1, the second width W2, and the third width W3.

Figure 3A:
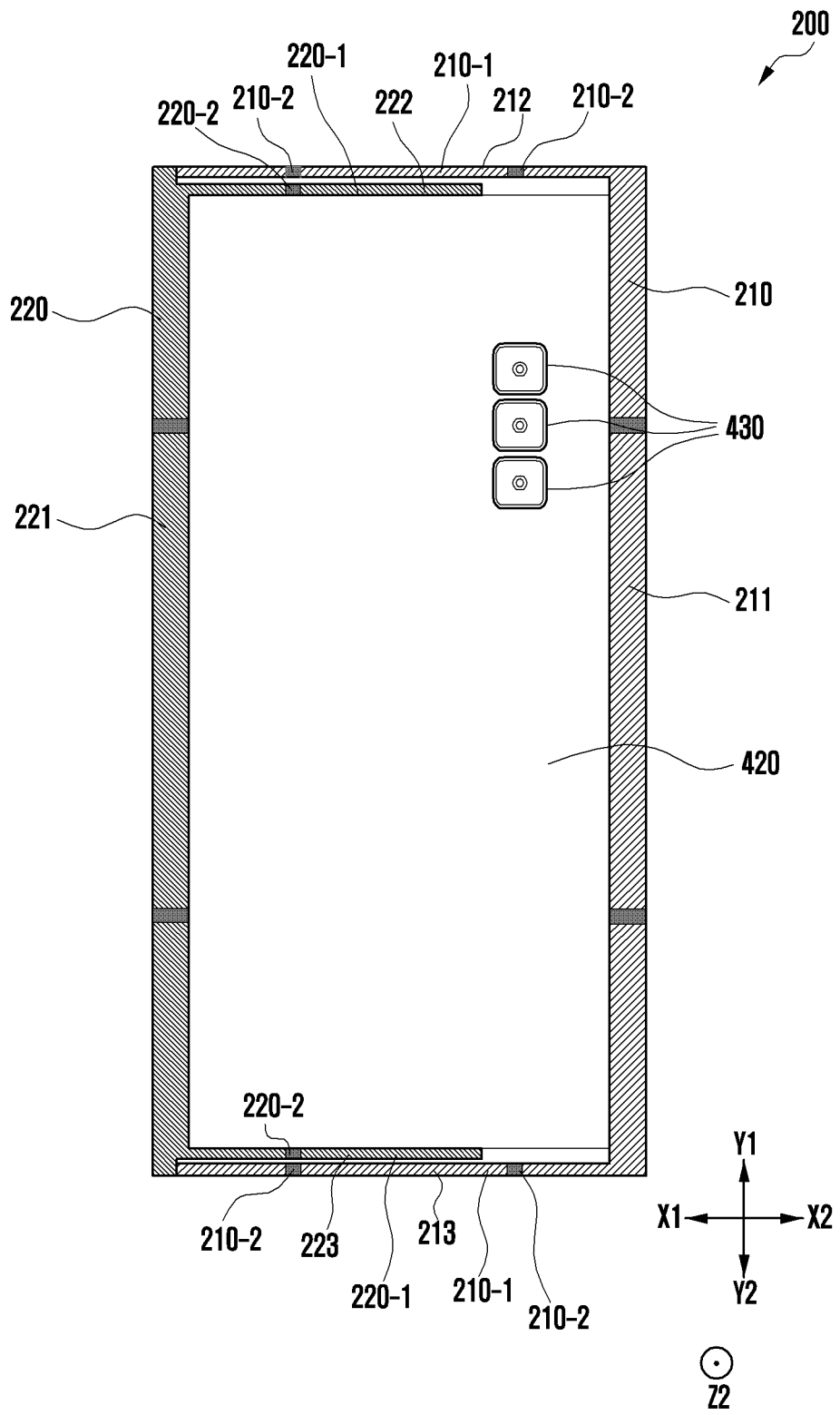
FIG. 3A is a rear view of an electronic device according to an embodiment in which a size of a rollable display is minimized.
Figure 3B:
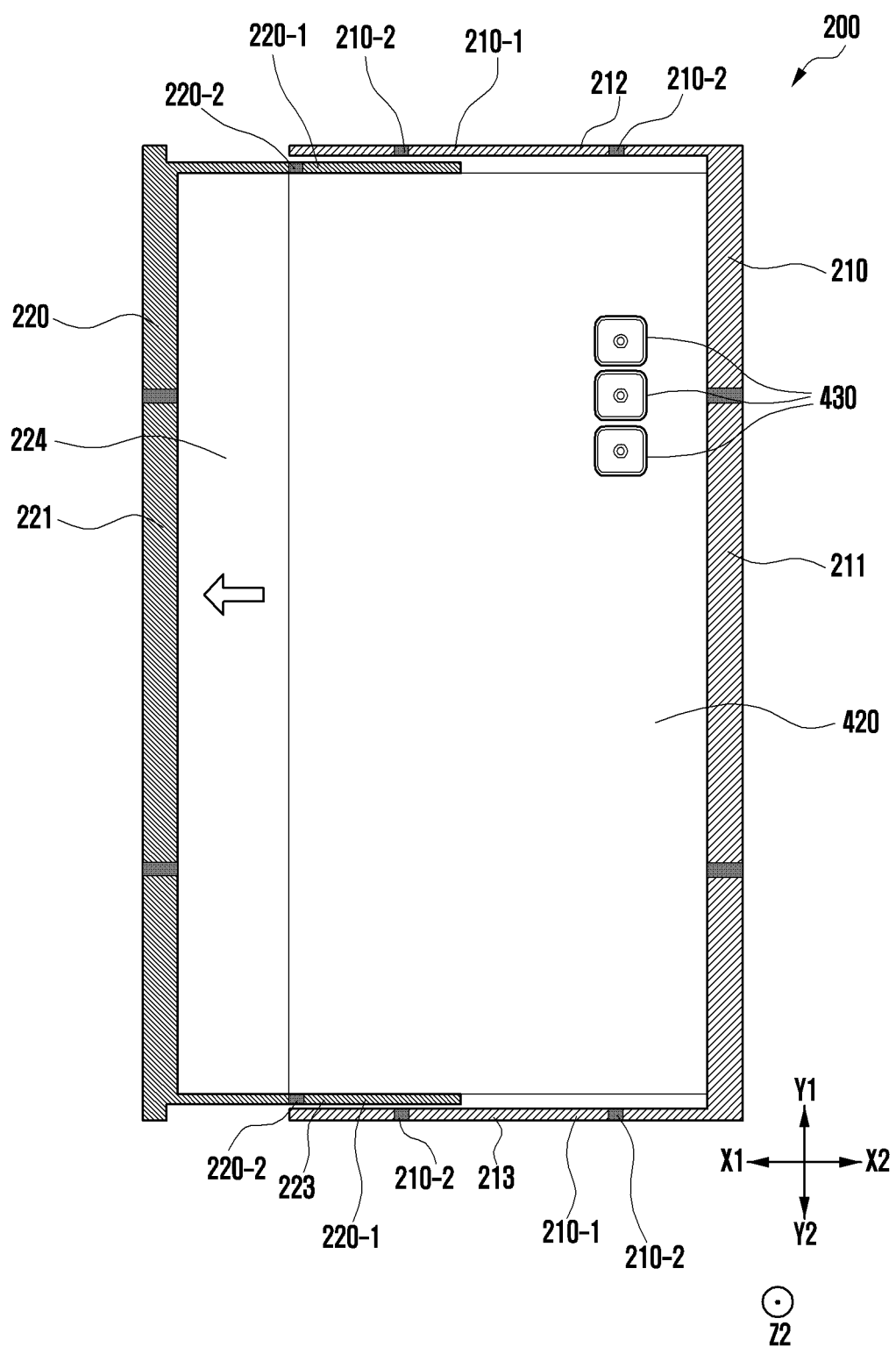
FIG. 3B is a rear view of an electronic device according to an embodiment in which a size of a rollable display is medium.
Figure 3C:
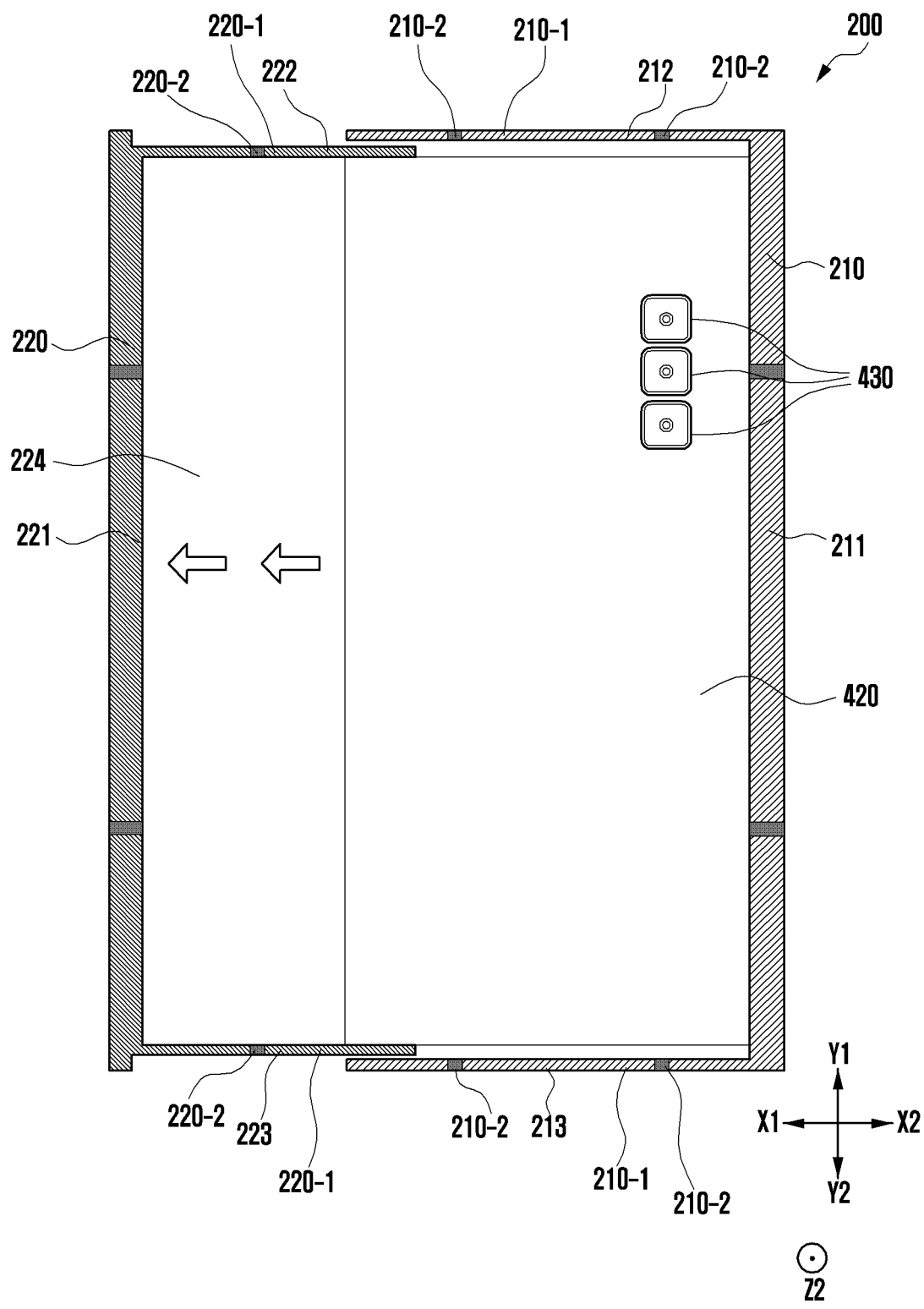
FIG. 3C is a rear view of an electronic device according to an embodiment in which a size of a rollable display is maximized.

FIG. 3A illustrates a first state of the electronic device 200 according to an embodiment (e.g., the state in which the rollable display 230 is minimized), and illustrates the state in which a portion of the rollable display 230 (e.g., the second region A2 in FIG. 2B and the third region A3 in FIG. 2C) is received in a housing. FIG. 3B illustrates a second state of the electronic device 200 according to an embodiment (e.g., the state in which the rollable display 230 has a medium-sized area), and illustrates the state in which a portion (e.g., the third region A3 in FIG. 2C) of the rollable display 230 is received in a housing. FIG. 3C illustrates a third state of the electronic device 200 according to an embodiment (e.g., the state in which the rollable display 230 is maximized), and illustrates the state in which most of the rollable display 230 is visually exposed to the exterior of the electronic device. FIG. 3A may be a rear view of the electronic device 200 according to an embodiment, which is seen along direction Z2 (e.g., the fourth direction opposite the third direction Z1), FIG. 3B may be a rear view of the electronic device 200 according to an embodiment, which is seen along direction Z2 (e.g., the fourth direction), and FIG.

3C may be a rear view of the electronic device 200 according to an embodiment, which is seen along direction Z2 (e.g., the fourth direction).

The electronic device 200 illustrated in FIGS. 3A to 3C may be at least partially similar or identical to the electronic device 200 illustrated in FIGS. 2A to 2C. Thus, duplicative descriptions thereof are omitted hereinafter with reference to FIGS. 3A to 3C.

Referring to FIGS. 3A to 3C, the first housing 210 according to one embodiment may further include a rear cover 420 which forms the rear of the electronic device 200 (e.g., the electronic device 101 in FIG. 1), and a camera module 430 (e.g., the camera module 180 in FIG. 1) may be exposed through at least a portion of the rear cover 420. The camera module 430 may be mounted to the first housing 210, and may capture images of a subject in the direction opposite to the first region A1 of the rollable display 230 (e.g., in the fourth direction Z2).

According to one embodiment, the electronic device 200 may include multiple camera modules 430. For example, the camera module 430 of the electronic device 200 may include a standard camera, a wide-angle camera, a telescope camera, or a close-up camera. According to other embodiments, the camera module 430 may include an infrared projector and/or an infrared receiver, and may thus measure the distance to a subject by using the same. According to one embodiment, the camera module 430 may include one or more lenses, an image sensor, and/or an image signal processor. Although not illustrated, the electronic device 200 may further include another camera module (e.g., a forward-facing camera) for capturing images of a subject in the forward direction (e.g., the third direction). For example, the forward-facing camera may be disposed near the first region A1 or in a region in which the forward-facing camera overlaps the rollable display 230. According to one embodiment, when the camera module 430 is disposed in a region in which the camera module 430 overlaps the rollable display 230, the camera module 430 may be disposed below the rollable display 230, and may capture images of the subject by receiving light passing through a portion of the rollable display 230.

Referring to FIGS. 3B and 3C, when the second housing 220 moves in a designated first direction X1, a portion of a slide plate supporting the rollable display 230 may be exposed when viewed in the direction Z2 from the rear of the electronic device 200.

FIG. 4 is an exploded perspective view of an electronic device 200 according to one embodiment.

The electronic device 200 illustrated in FIG. 4 may be at least partially similar or identical to the electronic device 200 illustrated in FIGS. 2A to 2C. Thus, duplicative descriptions thereof are omitted hereinafter with reference to FIG. 4.

Referring to FIG. 4, the electronic device 200 (e.g., the electronic device 101 in FIG. 1) according to one embodiment may include a first housing 210, a second housing 220, a rear cover 420, a first printed circuit board 440, a second printed circuit board 710, a roller 460, a magnet 470, and a rollable display 230.

According to one embodiment, the first housing 210 may include at least one first conductive portion 210-1 and at least one first non-conductive portion 210-2.

According to one embodiment, the second housing 220 may include at least one second conductive portion 220-1 and at least one second non-conductive portion 220-2.

The first printed circuit board 440 and the second printed circuit board 710 may be received or disposed in a space between the first housing 210 and the rear cover 420. Although not illustrated, a battery (e.g., the battery 189 in FIG. 1) may also be disposed in the space. The battery, which is a device for supplying power to at least one element of the electronic device 200, may include, for example, a non-rechargeable primary battery, a rechargeable secondary battery, or a fuel cell. The battery may be at least partially disposed in substantially the same plane as the first printed circuit board 440. The battery may be integrally disposed inside the electronic device 200. In another embodiment, the battery may be detachably disposed in the electronic device 200. Although not illustrated, a flexible circuit substrate, which includes a near-field communication (NFC) antenna, a wireless charging antenna, and/or a magnetic secure transmission (MST) antenna, may further be disposed in the space.

According to one embodiment, the rollable display 230 may include organic light-emitting diodes (OLEDs). For example, an unbreakable (UB)-type OLED rollable display 230 (e.g., curved display or flexible display) may be included.

The first printed circuit board 440 may include components, such as a camera module 430, a sliding sensor 441, an application processor (hereinafter, an AP 510), and a communication processor (hereinafter, CP 520). The application processor or the communication processor may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. § 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

The first printed circuit board 440 may include a memory (e.g., the memory 130 in FIG. 1) and/or an interface (e.g., the interface 177 in FIG. 1). The memory may include, for example, volatile memory or nonvolatile memory. The interface may include, for example, a high-definition multimedia interface (HDMI), a universal serial bus (USB) interface, an SD card interface, and/or an audio interface. The interface may electrically or physically connect the electronic device 200 to an external electronic device, and may include a USB connector, an SD card/MMC connector, or an audio connector.

According to one embodiment, the camera module 430 may be disposed to face the direction Z2 on the rear of the electronic device 200, and a portion (e.g., a lens) of the camera module 430 may be visually exposed through a camera hole formed in the rear cover 420.

According to one embodiment, the sliding sensor 441 may be a sensor for sensing the degree of sliding of the second housing 220 from the first housing 210. For example, the sliding sensor 441 may be a magnetic sensor for sensing magnetic force which varies depending on the distance between the sliding sensor 441 and the magnet 470 disposed in the second housing 220. According to other embodiments, other methods for sensing the degree of sliding of the second housing 220 from the first housing 210 by the sliding sensor 441 may be used.

According to one embodiment, the second printed circuit board 710 may be disposed in the second housing 220. The second printed circuit board 710 may include: a variable element 540 electrically connected to the second conductive portion 220-1 of the second housing 220; and an adjustment circuit 450 configured to adjust the capacitance and/or inductance of the variable element 540 to thereby adjust an electrical characteristic of the second conductive portion 220-1 of the second housing 220. One example of the adjustable electrical characteristic may be resonance characteristic. According to one embodiment, the adjustment circuit 450 may be omitted. For example, the adjustment circuit 450 may be included in the CP 520, or may be included in antenna-driving circuit 530 configured to operate an antenna radiator (e.g., the first conductive portion 210-1) of the first housing 210.

According to one embodiment, the variable element 540 may include a variable capacitor 541 and/or a variable inductor 542. According to one embodiment, the electronic device 200 may adjust the capacitance and/or inductance of the variable element 540 to adjust the resonance characteristics of the second conductive portions 220-1, which are formed on the fourth side wall 221, the fifth side wall 222, and/or the sixth side wall 223 of the second housing 220. The electronic device 200 may adjust the resonance characteristics of the second conductive portions 220-1 of the second housing 220 according to sliding of the second housing 220 with respect to the first housing 210.

According to one embodiment, the electronic device 200 may adjust the resonance characteristics of the second conductive portions 220-1 of the second housing 220 to reduce the phenomenon in which the second conductive portions 220-1 interfere with the first conductive portions 210-1 of the first housing 210, when both the second conductive portions 220-1 and the first conductive portions 210-1 are antenna radiators.

According to one embodiment, the roller 460 may be coupled to a portion of the second housing 220. The roller 460 may guide the movement of a portion (e.g., the second region A2 and the third region A3 in FIGS. 2B and 2C) of the rollable display 230 according to the movement of the second housing 220. For example, according to the movement of the second housing 220 in the first direction X1, the roller 460 may rotate in the counterclockwise direction while its axis is fixed, and may guide the rollable display 230 such that a portion of the rollable display 230 slides out. According to the movement of the second housing 220 in the second direction X2 opposite to the first direction X1, the roller 460 may rotate in the clockwise direction while its axis is fixed, and may guide the rollable display 230 such that a portion of the second housing 220 slides in and a portion of the rollable display 230 is rolled up.

Figure 5:
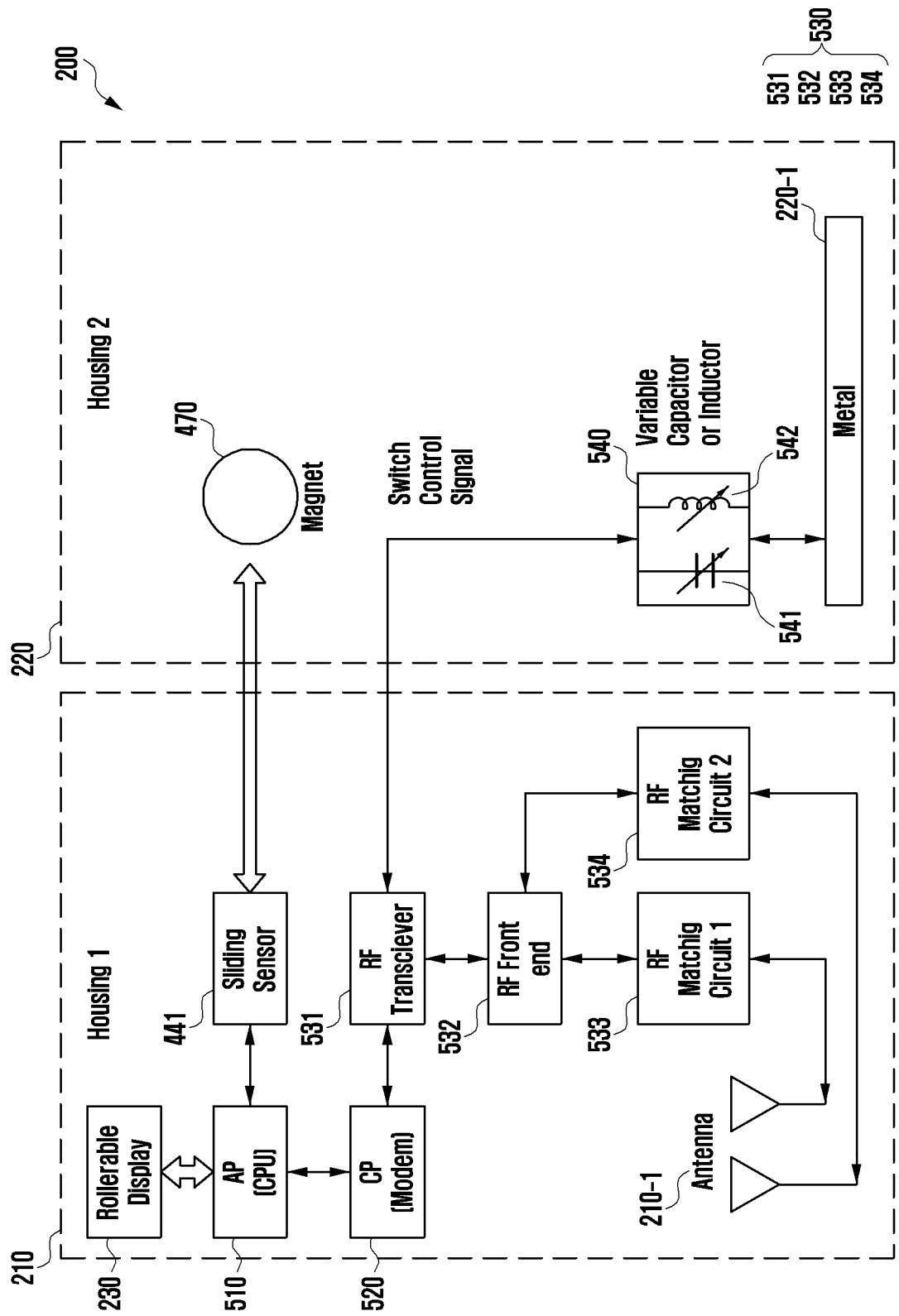
FIG. 5 is a block diagram illustrating the configuration of an electronic device according to one embodiment.
Figure 6:
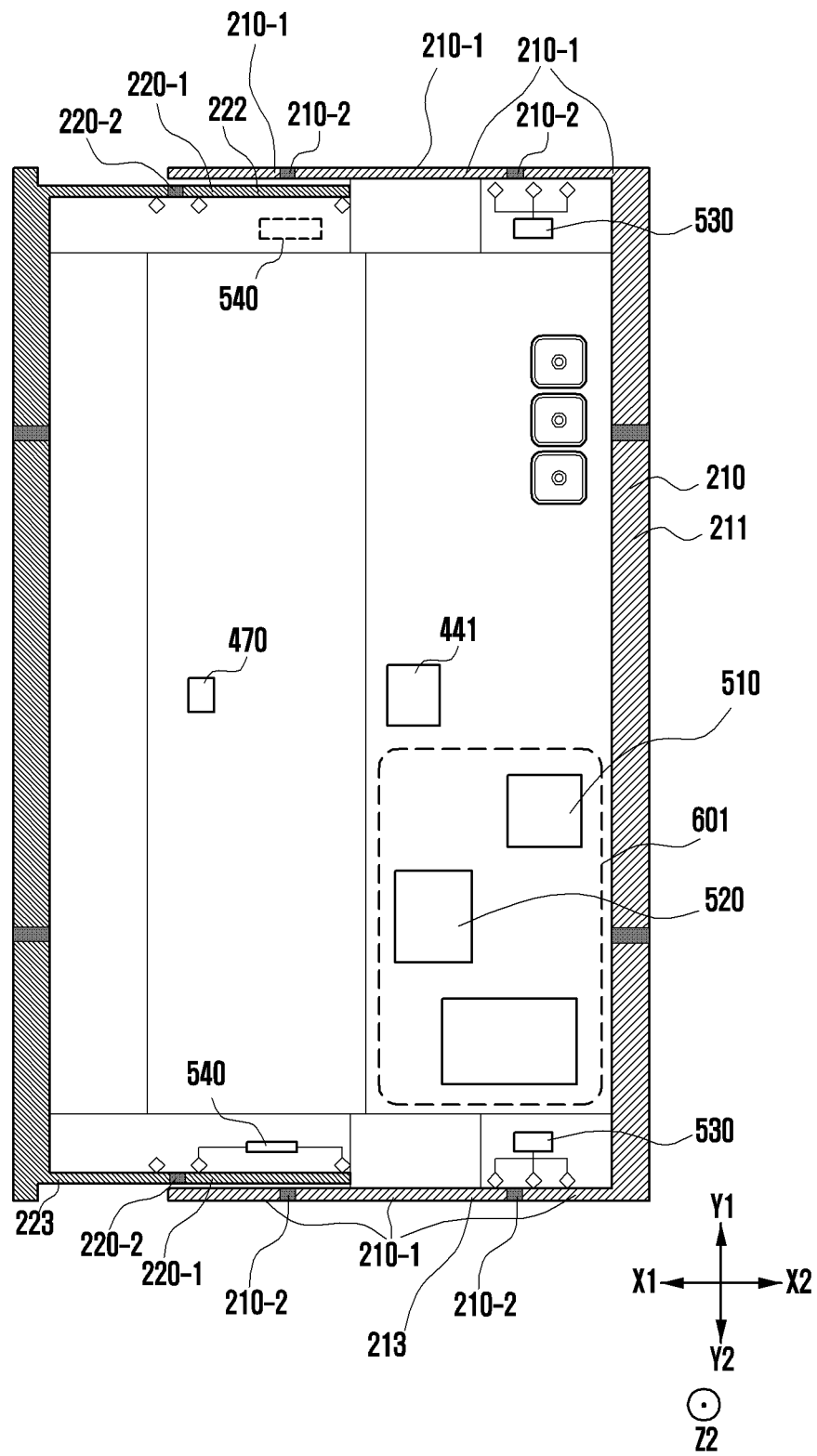
FIG. 6 is a rear view of an electronic device according to one embodiment in which a rear cover is removed.
Figure 7:
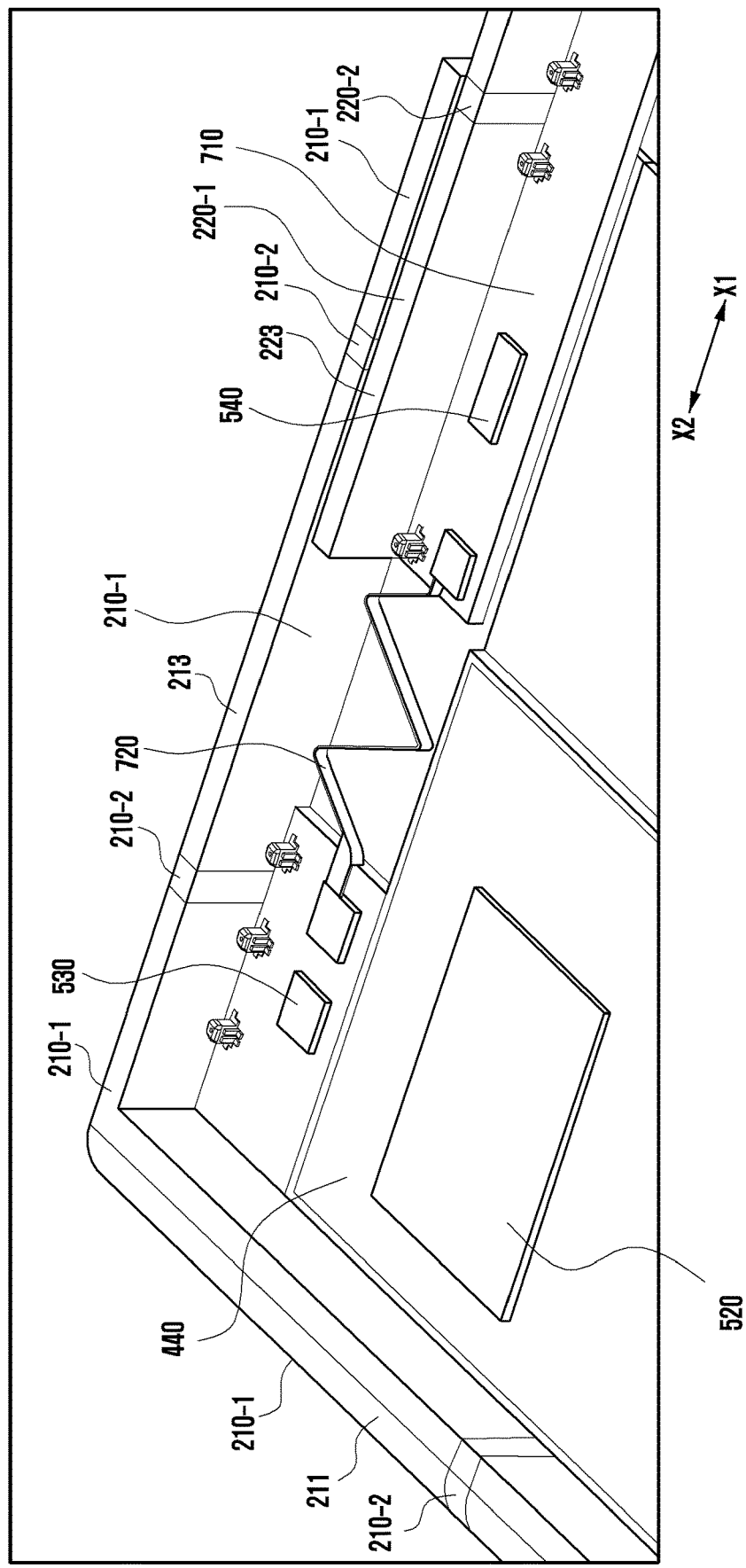
FIG. 7 shows an example in which a portion of the electronic device in FIG. 6, at which a variable element is disposed, is enlarged.

FIG. 5 is a block diagram illustrating the configuration of the electronic device 200 according to one embodiment. FIG. 6 is a rear view of the electronic device 200 according to one embodiment, which is seen along direction Z2 (e.g., the fourth direction). For example, FIG. 6 shows an example illustrating the electronic device 200 from which a rear cover 420 is removed. FIG. 7 shows an example in which a portion of the electronic device 200 shown in FIG. 6 at which a variable element 540 is disposed is enlarged. For example, FIG. 7 may be an example illustrating a portion adjacent to the third side wall 213 and the sixth side wall 223 illustrated in FIG. 6.

The electronic device 200 (e.g., the electronic device 101 in FIG. 1) illustrated in FIGS. 5 to 7 may be at least partially similar or identical to the electronic device 200 illustrated in FIGS. 2A to 4. Thus, duplicative descriptions thereof are omitted hereinafter with reference to FIGS. 5 to 7.

Referring to FIGS. 5 to 7, the electronic device 200 according to one embodiment may include: a first housing 210; and a second housing 220 capable of sliding from the first housing 210.

The first housing 210 may include a rollable display 230, an AP 510, a CP 520, and/or an antenna-driving circuit 530. According to an embodiment, as illustrated in FIG. 6, the AP 510, the CP 520, and/or the antenna-driving circuit 530 may be integrated as a single IC 601.

According to one embodiment, the antenna-driving circuit 530 may drive a first conductive portion 210-1 formed in each of a first side wall 211, a second side wall 212, and a third side wall 213 of the first housing 210. The first conductive portion 210-1 functions as an antenna radiator.

According to one embodiment, the antenna-driving circuit 530 may include an RF transceiver 531, an RF front end 532, a first RF matching circuit 533, and/or a second RF matching circuit 534. The RF transceiver 531 may include: a first port for transmitting or receiving a signal having a first frequency; and a second port for transmitting or receiving a signal having a second frequency, which is higher than the first frequency. The RF front end 532 may include a duplexer or a power amplifier. The first RF matching circuit 533 may include a first filter corresponding to a first frequency band. The second RF matching circuit 534 may include a second filter corresponding to a second frequency band.

According to one embodiment, the antenna-driving circuit 530 include multiple RF front ends 532. When the antenna-driving circuit 530 includes multiple RF front ends 532, two RF front ends 532 (e.g., a first RF front end and a second RF front end) may be connected to the first port and the second port of the RF transceiver 531, respectively. According to one embodiment, when multiple RF front ends 532 are included, the first RF matching circuit 533 and/or the second RF matching circuit 534 may be included in the respective RF front ends 532 (e.g., the first RF front end and the second RF frond end).

According to one embodiment, the first housing 210 may further include a sliding sensor 441 for sensing the distance between the sliding sensor 441 and a magnet 470 formed in the second housing 220.

The second housing 220 may include second conductive portions 220-1 disposed opposite to or close to at least a portion of the first housing 210. The second conductive portions 220-1 are disposed close to an antenna radiator (e.g., the first conductive portion 210-1), and may thus affect the resonance characteristics of the antenna radiator. In the electronic device 200 according to certain embodiments, the variable element 540 electrically connected to the second conductive portions 220-1 may be disposed in the second housing 220.

According to one embodiment, the variable element 540 may be disposed adjacent to the sixth side wall 223 of the second housing 220, which is disposed opposite to or adjacent to the third side wall 213 of the first housing 210. According to an embodiment, the variable element 540 may also be disposed at a portion adjacent to the fifth side wall 222, in addition to a portion adjacent to the sixth side wall 223. Although not illustrated, the variable element 540 may alternatively be disposed adjacent to the fourth side wall 221.

According to one embodiment, the variable element 540 may include a variable capacitor 541 and/or a variable inductor 542. The electronic device 200 may adjust, according to the movement of the second housing 220, the capacitance and/or inductance of the variable element 540 to thereby adjust resonance characteristics of the second conductive portions 220-1. Therefore, the electronic device 200 according to certain embodiments may reduce the influence of the second conductive portions 220-1 of the second housing 220 on the antenna radiator, and may increase antenna efficiency.

Referring to FIG. 7, the antenna-driving circuit 530 may be disposed on a first printed circuit board 440 of the first housing 210, and may be disposed adjacent to the first conductive portion 210-1, which is an antenna radiator. The variable element 540 may be disposed adjacent to a second conductive portion 220-1 on a second printed circuit board 710. The first printed circuit board 440 and the second printed circuit board 710 may be electrically connected to each other via a flexible circuit board 720. The flexible circuit substrate 720 may include a line for transmitting a switching signal output from the antenna-driving circuit 530 on the first printed circuit board 440. For example, the switching signal output from the antenna-driving circuit 530 may be supplied to the variable element 540 on the second printed circuit board 710 via the flexible circuit substrate 720. According to one embodiment, the capacitance and/or inductance of the variable element 540 may be adjusted in response to the switching signal, and, as a result, it is possible to adjust the resonance characteristics of the second conductive portions 220-1. According to other embodiments, the switching signal is not limited to a signal output from the antenna-driving circuit, and may be output from the CP 520 or from the AP 510.

According to certain embodiments, the flexible circuit substrate 720 may include at least one of a flexible printed circuit board (FPCB), a flat ribbon cable (FRC), or a rigid-flexible printed circuit board (RFCPB). For example, the first printed circuit board 440 may be electrically connected to the second printed circuit board 710 via a flat ribbon cable (FRC).

Figure 8:
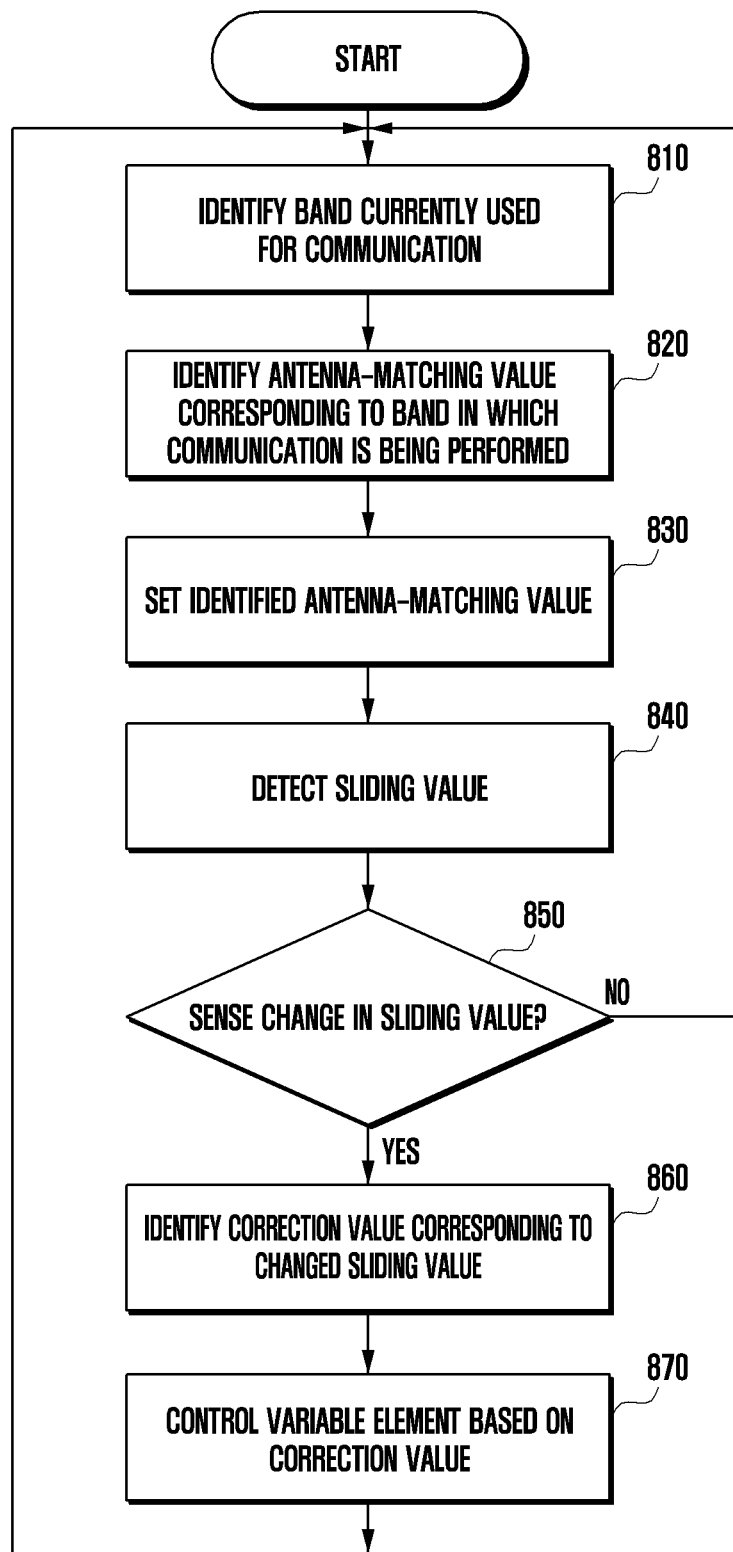
FIG. 8 is a flowchart illustrating the operation of an electronic device according to one embodiment.

FIG. 8 is a flowchart illustrating the operation of the electronic device 200 according to an embodiment.

The operations illustrated in FIG. 8 may be performed by a processor (e.g., the processor 120 in FIG. 1). For example, a memory (e.g., memory 130 in FIG. 1) of the electronic device 200 may store instructions that cause the processor to perform the operations illustrated in FIG. 8 when the instructions are executed. Hereinafter, the operation of the electronic device 200 according to an embodiment will be described with reference to FIG. 8.

According to another embodiment, the operations illustrated in FIG. 8 may be performed by a communication processor (e.g., the CP 520 in the FIG. 5). For example, a communication processor (e.g., the CP 520 in FIG. 5) included in a communication module (e.g., the communication module 190 in FIG. 1) may receive a sliding value transmitted from an AP (the AP 510 in FIG. 5) and/or a sliding sensor (e.g., the sliding sensor 441 in FIG. 5).

In operation 810, the electronic device 200 (e.g., the electronic device 101 in FIG. 1) according to one embodiment may identify a band currently being used for communication.

In the disclosure, the band or the frequency band may be a band defined in the 3GPP. Further, the term "bandwidth" may refer to an uplink/downlink frequency range of the frequency band. In frequency division duplex (FDD), the uplink frequency range is different from the downlink frequency range. On the other hand, in time division duplexing (TDD), the uplink frequency range is the same as the downlink frequency range. Further, frequency bands may be sorted into low band, mid-band, and high band depending on the bandwidth that is used. For example, according to 3GPP band definition, bands may be sorted into three groups (low-band/mid-band/high-band) based on allocated bandwidths, as shown in Table 1.

TABLE 1

| Band No. | Band Definition | Uplink Frequency Range | Downlink Frequency Range | FDD/TDD |
|---|---|---|---|---|
| 1 | Mid-Band | 1920-1980 | 2110-2170 | FDD |
| 2 | Mid-Band | 1850-1910 | 1930-1990 | FDD |
| 3 | Mid-Band | 1710-1785 | 1805-1880 | FDD |
| 4 | Mid-Band | 1710-1755 | 2110-2155 | FDD |
| 5 | Low-Band | 824-849 | 869-894 | FDD |
| 7 | High-Band | 2500-2570 | 2620-2690 | FDD |
| 8 | Low-Band | 880-915 | 925-960 | FDD |
| 9 | Mid-Band | 1749.9-1784.9 | 1844.9-1879.9 | FDD |
| 10 | Mid-Band | 1710-1770 | 2110-2170 | FDD |
| 11 | Mid-Band | 1427.9-1452.9 | 1475.9-1500.9 | FDD |
| 12 | Low-Band | 698-716 | 728-746 | FDD |
| 13 | Low-Band | 777-787 | 746-756 | FDD |
| 14 | Low-Band | 788-798 | 758-768 | FDD |
| 17 | Low-Band | 704-716 | 734-746 | FDD |
| 18 | Low-Band | 815-830 | 860-875 | FDD |
| 19 | Low-Band | 830-845 | 875-890 | FDD |
| 20 | Low-Band | 832-862 | 791-821 | FDD |
| 21 | Mid-Band | 1447.9-1462.9 | 1495.5-1510.9 | FDD |
| 25 | Mid-Band | 1850-1915 | 1930-1995 | FDD |
| 26 | Low-Band | 814-849 | 859-894 | FDD |
| 28 | Low-Band | 703-748 | 758-803 | FDD |
| 33 | Mid-Band | 1900-1920 | 1900-1920 | TDD |
| 38 | High-Band | 2570-2620 | 2570-2620 | TDD |
| 39 | Mid-Band | 1880-1920 | 1880-1920 | TDD |
| 40 | High-Band | 2300-2400 | 2300-2400 | TDD |
| 41 | High-Band | 2496-2690 | 2496-2690 | TDD |
| 44 | Low-Band | 703-803 | 703-803 | TDD |

Bands may be categorized into a first frequency band having a bandwidth belonging to a first frequency range, a second frequency band having a bandwidth belonging to a second frequency range, and a third frequency band having a bandwidth belonging to a third frequency range. Herein, the second frequency range may be defined as having a value that is greater than the maximum value of the first frequency range and smaller than the minimum value of the third frequency range. In one embodiment, the first frequency band, the second frequency band, and the third frequency band may respectively correspond to Low-Band, Mid-Band, and High-Band, defined in 3GPP. However, in another embodiment, the frequency band, the second frequency band, and the third frequency band may be defined differently from the definition of 3GPP. For example, a band using frequency of 2000 MHz or higher may be defined as the third frequency band.

In an embodiment of the disclosure, for convenience and ease of description, the first frequency band may be considered to be a low-band (LB), the second frequency band may be considered to be a mid-band (MB), and the third frequency band may be considered to be a high-band HB). For example, the LB may be about 700 to 900 MHz, the MB may be 1.4 GHz to 2.2 GHz, and the HB may be 2.3 GHz to 2.7 GHz. In another example, a first mid-band MB1 may be a frequency band including 1.5 GHz, and a second mid-band MB2 maybe a frequency band including 1.7 GHz. Herein, the first frequency band may be considered to be LB, the second frequency band may be considered to be MB1, and the third frequency band may be considered to be MB2 and HB. In another example, LB may be about 700 to 900 MHz, MB1 may be 1.4 GHz to 2.2 GHz, MB2 may be 2.3 GHz to 2.7 GHz, and HB may be 5 GHz to 6 GHz. However, the criteria for categorization may be defined differently from those presented in the above-mention example or in the 3GPP standard, and bands may be categorized into four or five or more frequency bands.

In operations 820 and 830, the electronic device 200 according to one embodiment may identify an antenna-matching value corresponding to the band currently used for communication, and may set the identified antenna-matching value. For example, when the electronic device 200 is performing communication in LTE Band 3 (1710 to 1880 MHz), the antenna-driving circuit 530 may set a matching filter such that an antenna radiator resonates in the band.

In operation 840, the electronic device 200 according to one embodiment may detect a sliding value. For example, the electronic device 200 may sense the degree of sliding of the second housing 220 from the first housing 210, and may convert the sensed degree to a numerical value to determine a sliding value. In an embodiment, the electronic device 200 may measure, using the sliding sensor 441, the distance between the first housing 210 and the second housing 220, and may determine a numerical value corresponding to the measured distance as the sliding value.

In operation 850, the electronic device 200 according to one embodiment may sense a change in the sliding value. According to one embodiment, when a change in the sliding value is sensed (e.g., when the result of operation 850 is "Yes"), the electronic device 200 may proceed to and perform operation 860. According to one embodiment, when no change in the sliding value is sensed (e.g., when the result of operation 850 is "No"), the electronic device 200 may return to and perform operation 810.

In operations 860 and 870, the electronic device 200 according to one embodiment may identify a correction value corresponding to the changed sliding value. The correction value may be a value which is used when the electronic device 200 adjusts the capacitance and/or inductance of the variable element 540. The electronic device 200 may adjust, based on the correction value, the capacitance and/or inductance of the variable element 540, thereby adjusting a resonance characteristic of the second conductive portion 220-1 of the second housing 220. When the resonance characteristic of the second conductive portion 220-1 is adjusted, it is possible to reduce the influence of the second conductive portion 220-1 on the first conductive portion 210-1 of the first housing 210, which is functioning as an antenna radiator.

According to an embodiment, as shown in Table 2, the correction value may include values which are designated for each band currently used for communication.

TABLE 2

| Band | Sliding Value (1-100) | Correction Value |
|---|---|---|
| Band 1 | 1-10 | A1 |
|  | 11-20 | A2 |
|  | 21-30 | A3 |
|  | (Omitted) | Ak |
|  | 91-100 | An |
| Band 2 | 1-10 | B1 |
|  | 11-20 | B2 |
|  | 21-30 | B3 |
|  | (Omitted) | Bk |
|  | 91-100 | Bn |
| ... (Band 44) | (The rest are omitted) | (The rest are omitted) |

In Table 2, 1-100 indicating sliding values may be relative numerical values indicating the degree of sliding of the second housing 220 from the first housing 210. For example, 1 may be the minimum sliding value, 100 is the maximum sliding value.

In Table 2, A1, A2, A3, Ak, . . . An, B1, B2, B3, and the like, indicating correction values, may be values necessary for the capacitance of the variable element 540 or the inductance of the variable element 540. At least some of the correction values A1, A2, A3, Ak, . . . An, B1, B2, B3, and the like may be equal to each other.

The capacitance and/or inductance of the variable element 540 can be adjusted by various methods. One such method to change the capacitance and/or inductance is by adjusting configuration values of switches that are connected to the antennas (not shown in the figures). This is illustrated in the below Table 3.

TABLE 3

| Band | | Sliding value (1~100) | Correction value | | | | | | rest omitted |
|---|---|---|---|---|---|---|---|---|---|
| | | | ANT0 | | | ANT1 | | | |
| | | | Switch 01 | Switch 02 | Switch n | Switch 01 | Switch 02 | Switch n | |
| Band 71 | Low | 1~10 | a | a | a | a | a | a | |
|  | Mid |  | b | b | b | b | b | b | |
|  | High |  | c | c | c | c | c | c | |
|  | Low | 11~20 | . | . | . | . | . | . | |
|  | Mid |  | . | . | . | . | . | . | |
|  | High |  | . | . | . | . | . | . | |
|  | Low |  |  |  | omitted |  |  |  | |
|  | Mid |  |  |  |  |  |  |  | |
|  | High |  |  |  |  |  |  |  | |
|  | Low | 91~100 | . | . | . | . | . | . | |
|  | Mid |  | . | . | . | . | . | . | |
|  | High |  | n | n | n | n | n | n | |

TABLE 3-continued

| Band | | Sliding value (1~100) | Correction value | | | | | | rest omitted |
|---|---|---|---|---|---|---|---|---|---|
| | | | ANT0 | | | ANT1 | | | |
| | | | Switch 01 | Switch 02 | Switch n | Switch 01 | Switch 02 | Switch n | |
| Band 12 | Low | 1~10 | a | a | a | a | a | a | |
| | Mid | | b | b | b | b | b | b | |
| | High | | c | c | c | c | c | c | |
| | Low | 11~20 | . | . | . | . | . | . | |
| | Mid | | . | . | . | . | . | . | |
| | High | | . | . | . | . | . | . | |
| | Low | | | | omitted | | | | |
| | Mid | | | | | | | | |
| | High | | | | | | | | |
| | Low | 91~100 | . | . | . | . | . | . | |
| | Mid | | . | . | . | . | . | . | |
| | High | | n | n | n | n | n | n | |
| | | | | | rest omitted | | | | |

The correction values such as "a," "b," "c," to "n" can be selected to optimize the antenna efficiency.

Figure 9:
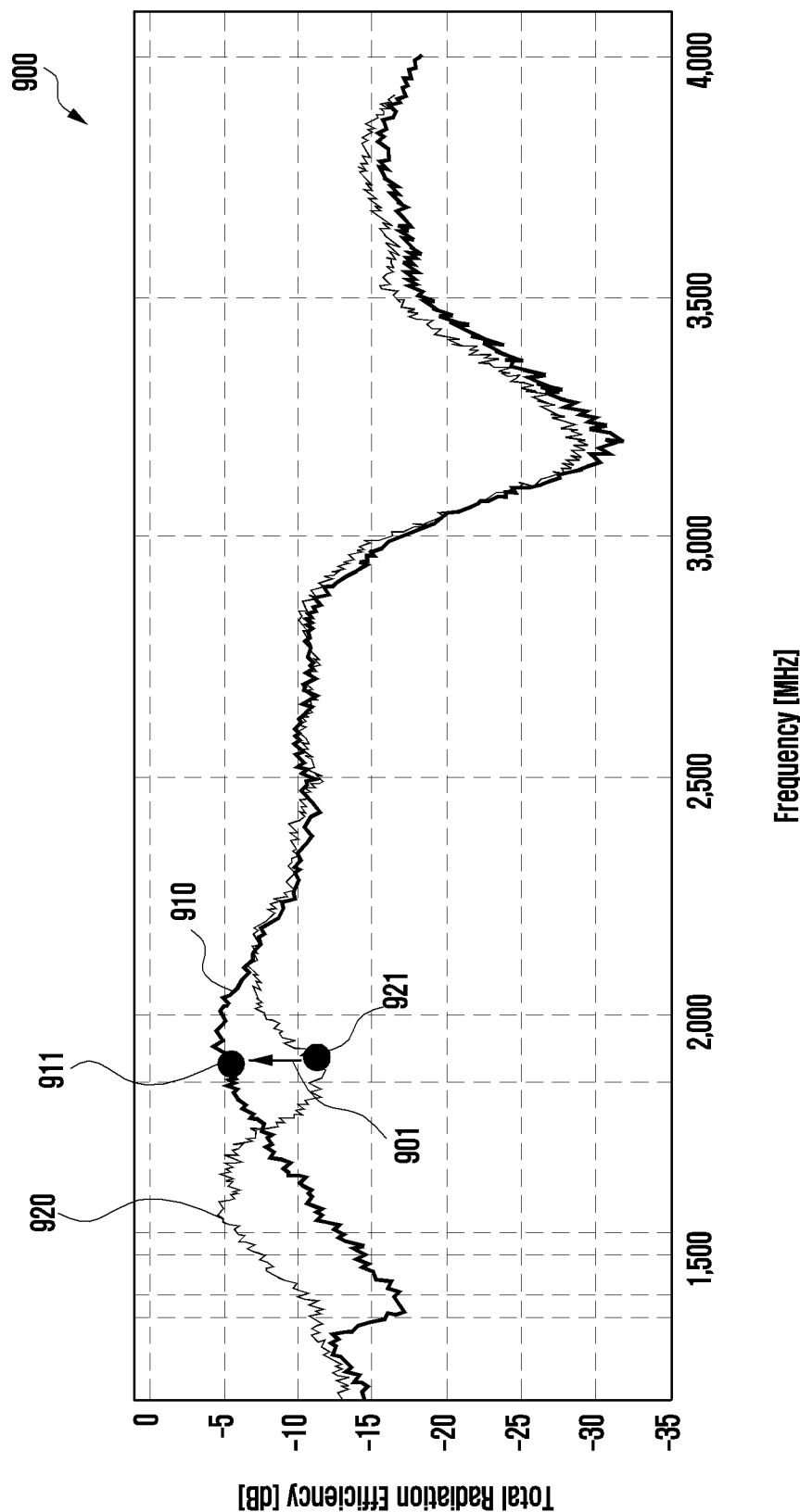
FIG. 9 shows the result of an experiment for measuring the efficiency of an antenna of an electronic device according to one embodiment.

FIG. 9 shows the result 900 of an experiment for measuring the efficiency of an antenna of the electronic device 200 according to an embodiment. For example, FIG. 9 may be the result of measuring antenna efficiency when the capacitance of the variable element 540 has been adjusted according to the movement of the second housing 220.

Graph 910 in FIG. 9 shows the result of measuring antenna efficiency when the capacitance of the variable element 540 has been adjusted according to the movement of the second housing 220.

Graph 920 in FIG. 9 shows the result of measuring antenna efficiency when the capacitance of the variable element 540 has not been adjusted according to the movement of the second housing 220.

In the experiment of FIG. 9, the band used by the electronic device 200 to perform communication is about 1800 MHz, and graph 910 may be the result of tuning the capacitance of the variable element 540 while considering the used band of about 1800 MHz.

When the capacitance of the variable element 540 is increased, the resonance frequency of the second conductive portion 220-1 may be reduced. The electronic device 200 may increase the capacitance of the variable element 540 such that the second conductive portion 220-1 resonates at a frequency lower than about 1800 MHz, and thus the efficiency of an antenna radiator (e.g., the first conductive portion 210-1) may be increased at about 1800 MHz.

When graph 910 is compared with graph 920 at about 1800 MHz, it can be understood that the difference between the efficiency in the portion 921 corresponding to about 1800 MHz in graph 920 and the efficiency in the portion 911 corresponding to about 1800 MHz in graph 910 is about 5 dB or more, as shown by arrow 901.

Figure 10:
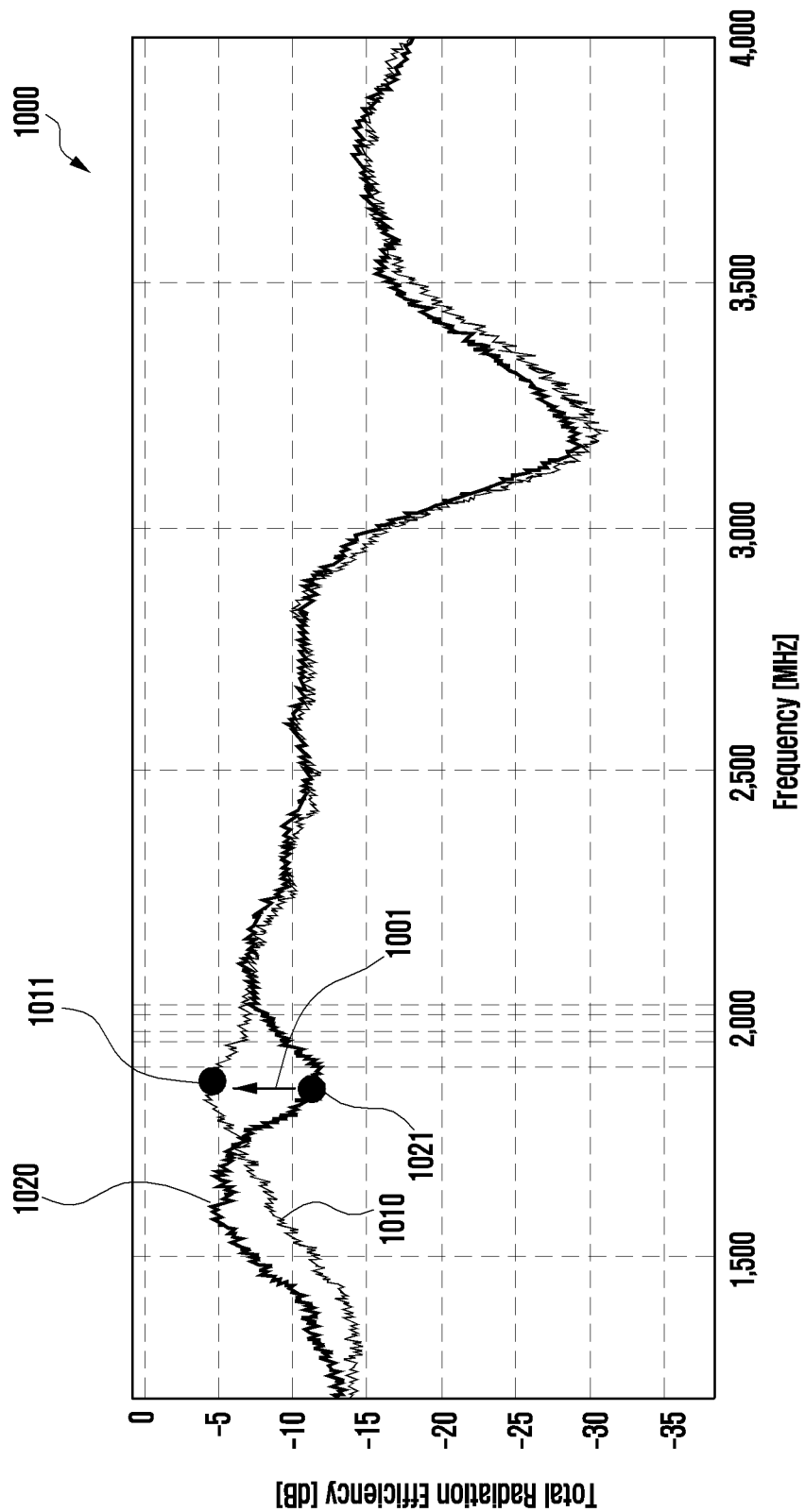
FIG. 10 shows the result of another experiment for measuring the efficiency of an antenna of an electronic device according to one embodiment.

FIG. 10 shows the result 1000 of another experiment for measuring the efficiency of an antenna of the electronic device 200 according to an embodiment. For example, FIG. 10 shows the result of measuring antenna efficiency when the inductance of the variable element 540 has been adjusted according to the movement of the second housing 220.

Graph 1010 in FIG. 10 shows the result of measuring antenna efficiency when the inductance of the variable element 540 has been adjusted according to the movement of the second housing 220.

Graph 1020 in FIG. 10 shows the result of measuring antenna efficiency when the inductance of the variable element 540 has not been adjusted according to the movement of the second housing 220.

In the experiment of FIG. 10, the band used by the electronic device 200 to perform communication is about 1900 MHz, and graph 1010 may be the result of tuning the inductance of the variable element 540 while considering the used band of about 1900 MHz.

When the inductance of the variable element 540 is increased, the resonance frequency of the second conductive portion 220-1 may be increased. The electronic device 200 may increase the inductance of the variable element 540 such that the second conductive portion 220-1 resonates at a frequency higher than about 1900 MHz, and thus the efficiency of an antenna radiator (e.g., the first conductive portion 210-1) may be increased at about 1900 MHz.

When graph 1010 is compared with graph 1020 at about 1900 MHz, it can be understood that the difference between the efficiency at the portion 1021 corresponding to about 1900 MHz in graph 1020 and the efficiency at the portion 1011 corresponding to about 1900 MHz in graph 1010 is about 5 dB or more, as shown by arrow 1001.

Certain of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

While the present disclosure has been shown and described with reference to various embodiments thereof, it will be understood by those skilled in the art that various changes in form and details may be made therein without departing from the present disclosure as defined by the appended claims and their equivalents.

What is claimed is:

1. An electronic device comprising:
   a first housing including a first conductive portion, wherein the first conductive portion is configured to be a portion of an antenna radiator;
   a second housing including a second conductive portion, wherein the second conductive portion is disposed adjacent to at least a portion of the first conductive portion in response to a sliding of the second housing from the first housing;
   a sensor configured to sense a degree of the sliding of the second housing;
   a variable element electrically connected to the second conductive portion;
   at least one processor; and
   a memory configured to store instructions that, when executed by the at least one processor, cause the electronic device to:
   adjust an electrical characteristic of the variable element in response to the sliding of the second housing, based on the sensed degree of the sliding of the second housing.

2. The electronic device of claim 1, wherein the memory is configured to store instructions that, when executed by the at least one processor, cause the electronic device to:
   change a capacitance of the variable element in response to the sliding of the second housing.

3. The electronic device of claim 2, wherein the memory is configured to store instructions that, when executed by the at least one processor, cause the electronic device to:
   reduce a resonant frequency of the second conductive portion by increasing the capacitance of the variable element.

4. The electronic device of claim 2, wherein the memory is configured to store instructions that, when executed by the at least one processor, cause the electronic device to:
   change an inductance of the variable element in response to sliding movement of the second housing.

5. The electronic device of claim 4, wherein the memory is configured to store instructions that, when executed by the at least one processor, cause the electronic device to:
   increase a resonant frequency of the second conductive portion by increasing the inductance of the variable element.

6. The electronic device of claim 1, wherein the first conductive portion is electrically connected to a communication module of the electronic device, and
   wherein the at least one processor is configured to perform cellular communication or short-range communication using the first conductive portion.

7. The electronic device of claim 1, wherein at least a portion of the first conductive portion and at least a portion of the second conductive portion are disposed to face each other.

8. The electronic device of claim 1, wherein the first conductive portion comprises a first side wall, a second side wall extending from one end of the first side wall and formed perpendicular to the first side wall, and a third side wall extending from another end of the first side wall and formed parallel to the second side wall, one or more of the first side wall to the third side wall being electrically connected to a communication module of the electronic device so as to transmit or receive an RF signal; and
   wherein the second conductive portion comprises a fourth side wall formed parallel to the first side wall, a fifth side wall extending from one end of the fourth side wall and disposed adjacent to the second side wall, and a sixth side wall extending from another end of the fourth side wall and disposed adjacent to the third side wall, one or more of the first side wall to the third side wall being electrically connected to the variable element.

9. The electronic device of claim 1, wherein the memory is configured to store instructions that, when executed by the at least one processor, cause the electronic device to:
   identify a band currently used by a communication module of the electronic device to perform communication,
   set an antenna-matching value corresponding to the band,
   determine a sliding value corresponding to a distance between the first housing and the second housing using the sensor,
   identify, upon determining a change in the sliding value, a correction value corresponding to the changed sliding value, and
   adjust the electrical characteristic of the variable element, based on the correction value.

10. The electronic device of claim 1, further comprising:
    a magnet disposed in the second housing,
    wherein the at least one processor is configured to measure a magnetic force from the magnet using the sensor so as to determine a distance between the first housing and the second housing.

11. The electronic device of claim 1, further comprising:
    a first printed circuit board disposed in the first housing and including the at least one processor and a communication module;
    a second printed circuit board disposed in the second housing and including the variable element; and
    a flexible circuit board connecting the first printed circuit board to the second printed circuit board.

12. A method of an electronic device comprising a first housing including a first conductive portion, wherein the first conductive portion is configured to be a portion of an antenna radiator, a second housing including a second conductive portion, wherein the second conductive portion is disposed adjacent to at least a portion of the first conductive portion in response to a sliding of the second housing from the first housing, a sensor configured to sense a degree of the sliding of the second housing from the first housing, a variable element electrically connected to the second conductive portion, and at least one processor, the method comprising:
    adjusting, by the at least one processor, an electrical characteristic of the variable element in response to the sliding of the second housing, based on the sensed degree of the sliding of the second housing.

13. The method of claim 12, further comprising:
    changing a capacitance of the variable element in response to the sliding of the second housing.

14. The method of claim 13, further comprising:
    reducing a resonant frequency of the second conductive portion by increasing the capacitance of the variable element.

15. The method of claim 13, further comprising:
    changing an inductance of the variable element in response to sliding movement of the second housing.

16. The method of claim 15, further comprising:
    increasing a resonant frequency of the second conductive portion by increasing the inductance of the variable element.

17. The method of claim 12, wherein the first conductive portion is electrically connected to a communication module of the electronic device, and further comprising:
    performing cellular communication or short-range communication using the first conductive portion.

18. The method of claim 12, wherein at least a portion of the first conductive portion and at least a portion of the second conductive portion are disposed to face each other.

19. The method of claim 12, further comprising:
wherein the first conductive portion comprises a first side wall, a second side wall extending from one end of the first side wall and formed perpendicular to the first side wall, and a third side wall extending from another end of the first side wall and formed parallel to the second side wall, one or more of the first side wall to the third side wall being electrically connected to a communication module of the electronic device so as to transmit or receive an RF signal; and
wherein the second conductive portion comprises a fourth side wall formed parallel to the first side wall, a fifth side wall extending from one end of the fourth side wall and disposed adjacent to the second side wall, and a sixth side wall extending from another end of the fourth side wall and disposed adjacent to the third side wall, one or more of the first side wall to the third side wall being electrically connected to the variable element.

20. The method of claim 12, further comprising:
identifying a band currently used by a communication module of the electronic device to perform communication,
setting an antenna-matching value corresponding to the band,
determining a sliding value corresponding to a distance between the first housing and the second housing using the sensor,
identifying, upon determining a change in the sliding value, a correction value corresponding to the changed sliding value, and
adjusting the electrical characteristic of the variable element, based on the correction value.

* * * * *